US011721593B2

(12) United States Patent
More

(10) Patent No.: US 11,721,593 B2
(45) Date of Patent: Aug. 8, 2023

(54) SOURCE/DRAIN EPITAXIAL STRUCTURES FOR SEMICONDUCTOR DEVICES

(71) Applicant: Taiwan Semiconductor Manufacturing Co., Ltd., Hsinchu (TW)

(72) Inventor: Shahaji B. More, Hsinchu (TW)

(73) Assignee: Tiawan Semiconductor Manufacturing Co., Ltd., Hsinchu (TW)

(*) Notice: Subject to any disclaimer, the term of this patent is extended or adjusted under 35 U.S.C. 154(b) by 10 days.

(21) Appl. No.: 17/210,784

(22) Filed: Mar. 24, 2021

(65) Prior Publication Data
US 2022/0102220 A1 Mar. 31, 2022

Related U.S. Application Data

(60) Provisional application No. 63/085,721, filed on Sep. 30, 2020.

(51) Int. Cl.
*H01L 21/8238* (2006.01)
*H01L 27/092* (2006.01)
(Continued)

(52) U.S. Cl.
CPC ........... *H01L 21/823814* (2013.01); *H01L 21/02609* (2013.01); *H01L 21/823821* (2013.01);
(Continued)

(58) Field of Classification Search
CPC ....... H01L 21/823814; H01L 21/02609; H01L 21/823821; H01L 21/823864;
(Continued)

(56) References Cited

U.S. PATENT DOCUMENTS 9,093,530 B2   7/2015  Huang et al.
9,171,929 B2  10/2015  Lee et al.
(Continued)

FOREIGN PATENT DOCUMENTS

TW   202020986 A   6/2020
TW   202020995 A   6/2020
TW   202030884 A   8/2020

*Primary Examiner* — Karen Kusumakar
*Assistant Examiner* — Adam S Bowen
(74) *Attorney, Agent, or Firm* — Sterne, Kessler, Goldstein & Fox P.L.L.C.

(57) ABSTRACT

The present disclosure describes a method of forming a semiconductor device having epitaxial structures with optimized dimensions. The method includes forming first and second fin structures on a substrate, forming a spacer layer on the first and second fin structures, forming a first spacer structure adjacent to the first fin structure, and forming a first epitaxial structure adjacent to the first spacer structure. The first and second fin structures are separated by an isolation layer. The first spacer structure has a first height above the isolation layer. The method further includes forming a second spacer structure adjacent to the second fin structure and forming a second epitaxial structure adjacent to the second spacer structure. The second spacer structure has a second height above the isolation layer greater than the first height. The second epitaxial structure includes a type of dopant different from the first epitaxial structure.

20 Claims, 24 Drawing Sheets

(51) Int. Cl.
*H01L 29/04* (2006.01)
*H01L 29/08* (2006.01)
*H01L 29/49* (2006.01)
*H01L 29/66* (2006.01)
*H01L 21/02* (2006.01)
*H01L 29/78* (2006.01)

(52) U.S. Cl.
CPC .. *H01L 21/823864* (2013.01); *H01L 27/0924* (2013.01); *H01L 29/045* (2013.01); *H01L 29/0847* (2013.01); *H01L 29/4983* (2013.01); *H01L 29/6656* (2013.01); *H01L 29/66795* (2013.01); *H01L 29/7851* (2013.01)

(58) Field of Classification Search
CPC ............... H01L 27/0924; H01L 29/045; H01L 29/0847; H01L 29/4983; H01L 29/6656; H01L 29/66795; H01L 29/7851; H01L 29/165; H01L 29/267; H01L 21/0243; H01L 21/0245; H01L 21/02502; H01L 21/02532; H01L 21/02576; H01L 21/02579; H01L 21/02639; H01L 21/02658; H01L 21/823878; H01L 29/7848; H01L 21/0262; H01L 21/823431; H01L 21/823481; H01L 27/0886

See application file for complete search history.

(56) References Cited

U.S. PATENT DOCUMENTS

| | | | |
|---|---|---|---|
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 10,950,730 | B2 | 3/2021 | Lin et al. |
| 10,964,816 | B2 | 3/2021 | Yang et al. |
| 2019/0131176 | A1* | 5/2019 | Liao .................... H01L 29/0847 |
| 2019/0157155 | A1* | 5/2019 | Keng ................ H01L 29/66795 |
| 2019/0326287 | A1* | 10/2019 | Liaw .................. H01L 29/6681 |
| 2020/0176597 | A1 | 6/2020 | Vellianitis et al. |

\* cited by examiner

SOURCE/DRAIN EPITAXIAL STRUCTURES FOR SEMICONDUCTOR DEVICES

CROSS-REFERENCE TO RELATED APPLICATIONS

This application claims the benefit of U.S. Provisional Patent Application No. 63/085,721, titled "Single Fin EPI Devices," filed Sep. 30, 2020, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
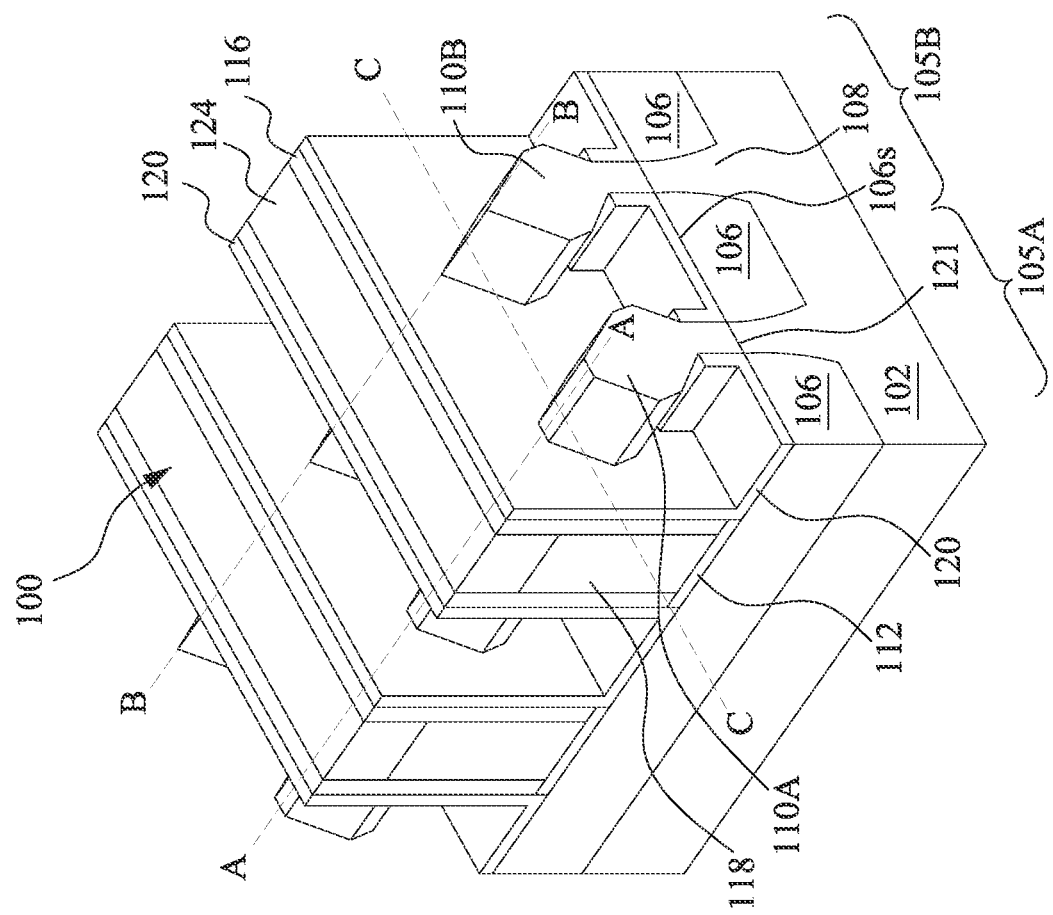
FIG. 1 illustrates an isometric view of a semiconductor device having source/drain (S/D) epitaxial structures with optimized dimensions, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant arts) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

The scaling down of FET devices has introduced short-channel effects (SCEs), which can reduce off-state current and device performance of the FET devices. The profiles of source/drain (S/D) epitaxial structures on the FET devices can affect the SCEs, device performance, and process yield. S/D epitaxial structures with larger dimensions can reduce contact resistances between S/D epitaxial structures and contact structures and improve device performance. However, S/D epitaxial structures with larger dimensions may form more epitaxial defects, such as bridging defects between adjacent S/D epitaxial structures. These detects can degrade device performance and process yield. In addition, n-type and p-type S/D epitaxial structures may have different shapes, such as a cone shape for n-type S/D epitaxial structures and a diamond shape for p-type S/D epitaxial structures. Larger dimensions may not be achieved for both n-type and p-type S/D epitaxial structures with the same process conditions.

Various embodiments in the present disclosure provide example methods for forming S/D epitaxial structures with optimized dimensions in field effect transistors (FET) devices (e.g., finFETs, gate-all-around FETs, MOSFETs, etc.) and/or other semiconductor devices in an integrated circuit (IC) and example semiconductor devices fabricated with the same methods. The example methods in the present disclosure can form a spacer layer on first and second fin structures. The first and second fin structures can be separated by an isolation layer and the first and second fin structures can have a first height above the isolation layer. In some embodiments, the spacer layer can include a layer of first dielectric material and a layer of second dielectric material different from the first dielectric material. The spacer layer on the first fin structure and the first fin structure can be selectively removed to form a first spacer structure adjacent to sidewalls of the first fin structure. The first spacer structure can have a second height above the isolation layer. A ratio of the second height to the first height can range from about 5% to about 45%. A first epitaxial structure can be formed having a cone shape with optimized dimensions on the first fin structure and between the first spacer structure. The first epitaxial structure can have a first width and a ratio of the first width to the first height can range from about 55% to about 95%. The spacer layer on the second fin structure and the second fin structure can be selectively removed to form a second spacer structure adjacent to sidewalls of the second fin structure. The second spacer structure can have a third height above the isolation layer greater than the second height. A ratio of the second height to the third height can range from about 40% to about 95%. A second epitaxial structure can be formed having a diamond shape with optimized dimensions on the second fin structure and between the second spacer structures. The second epitaxial structure can have a second width and a ratio of the second width to the first height can range from about 55% to about 95%. The second epitaxial structure can have a different type of dopant from the first epitaxial structure. With the control of the dimensions and profiles for the first and second spacer structures and growth processes of the first and second epitaxial structures, the first and second epitaxial structures can have optimized dimensions and profiles to reduce SCEs, reduce epitaxial detects, improve device performance, and improve process yield. In some embodiments, semiconductor devices having S/D epitaxial structures with optimized dimensions can improve process yield by about 2% to about 20% and improve device performance by about 2% to about 10%.

Though the present disclosure describes forming S/D epitaxial structures with optimized dimensions on a finFET, the S/D epitaxial structures with optimized dimensions and the methods for forming S/D epitaxial structures with optimized dimensions described herein can be applied to other FETs and other semiconductor devices, such as gate-all-around (GAA) FETs and MOSFETs.

Figure 2:
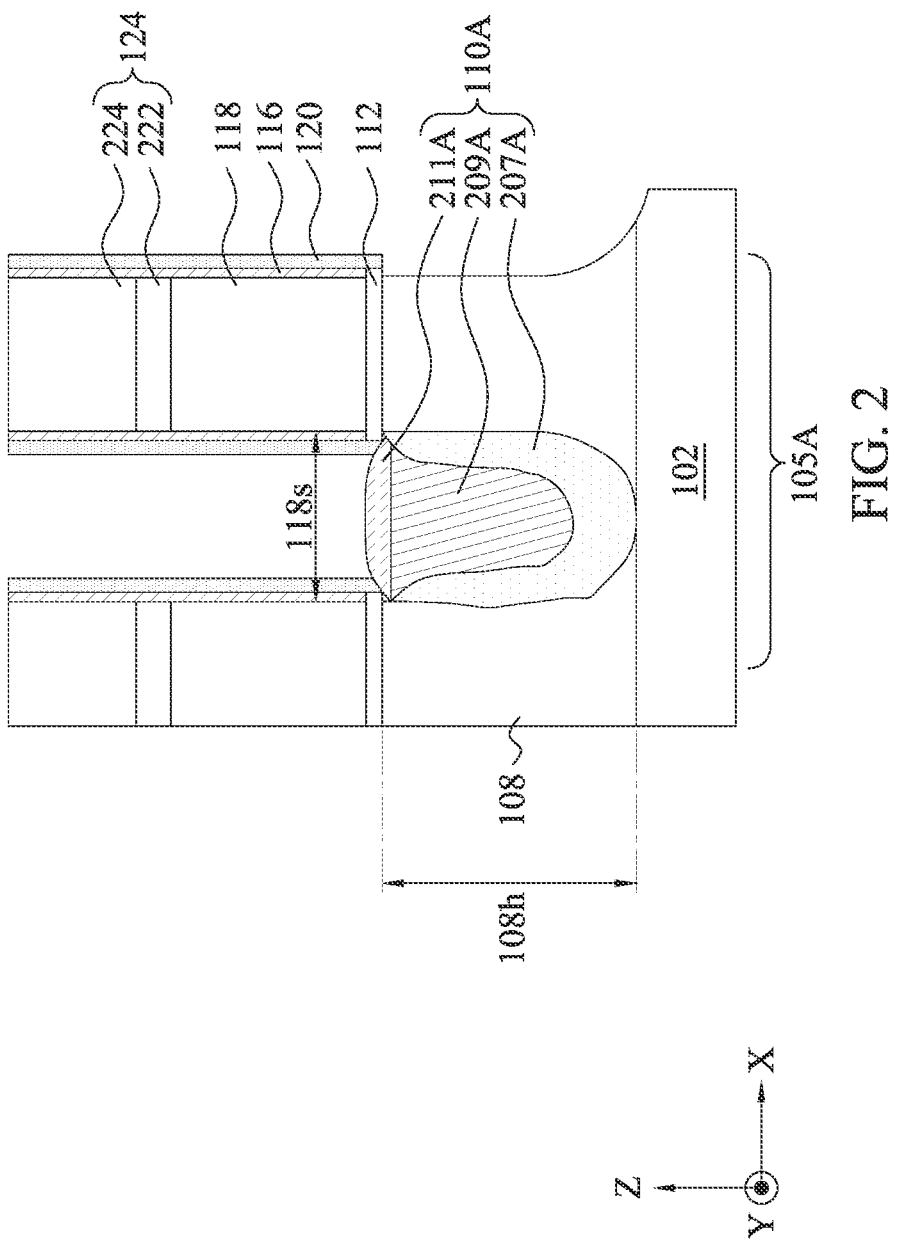
FIGS. 2-4 illustrate partial cross-sectional views of a semiconductor device having S/D epitaxial structures with optimized dimensions, in accordance with some embodiments.
Figure 3:
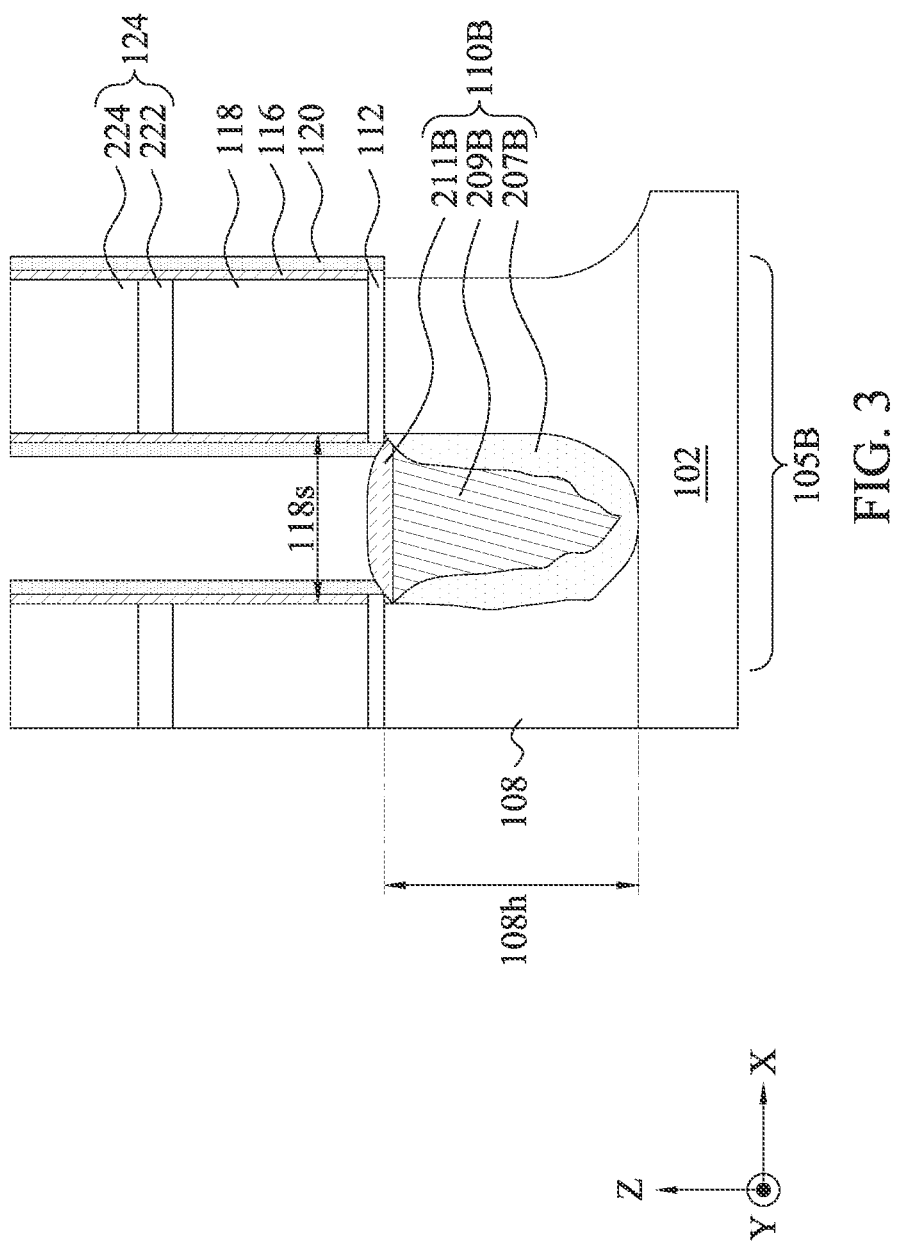
Figure 4:
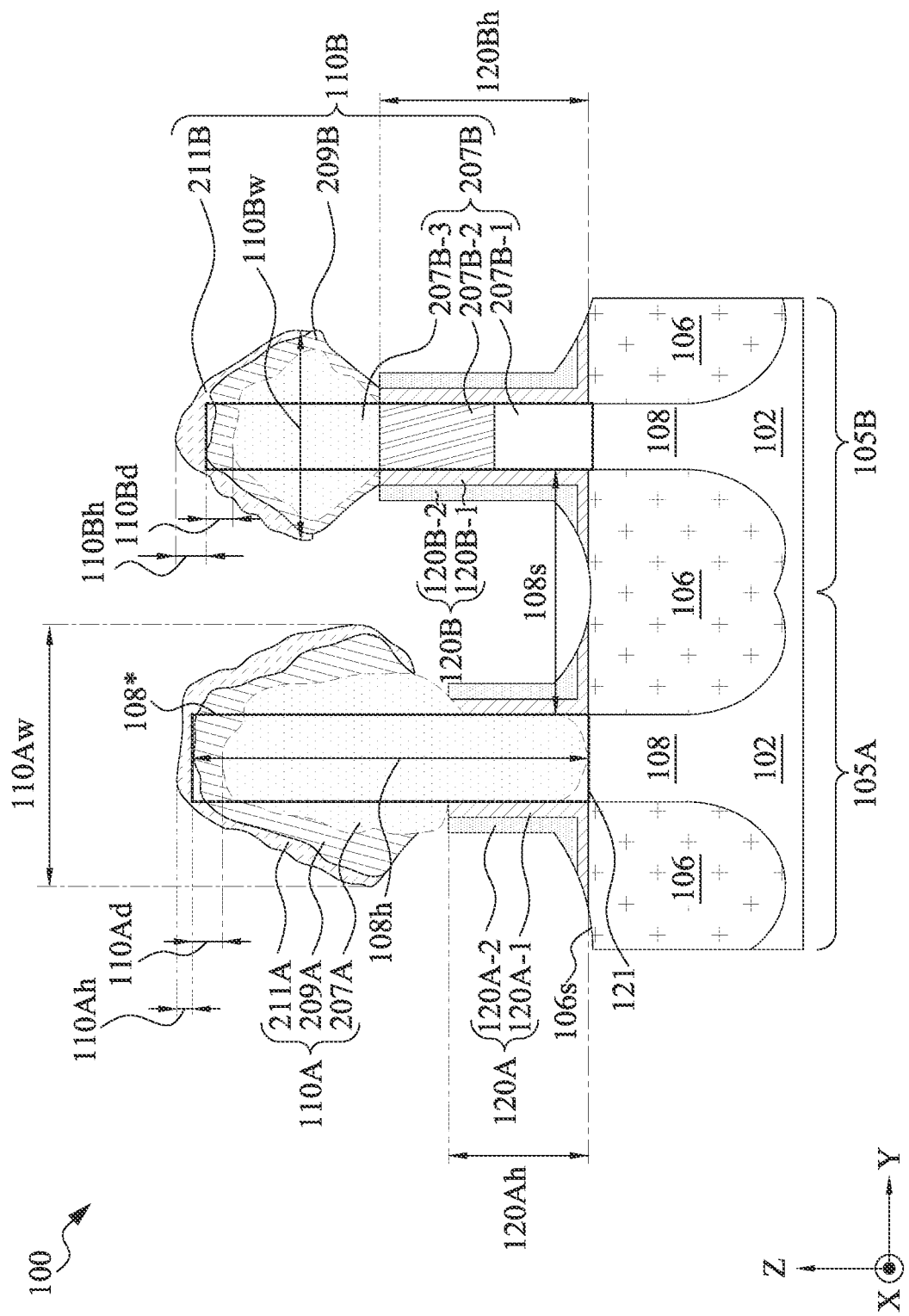

FIG. 1 illustrates an isometric view of a semiconductor device 100 having S/D epitaxial structures 110A and 110B (collectively referred to as "S/D epitaxial structures 110") with optimized dimensions, in accordance with some embodiments. FIG. 2 illustrates a partial cross-sectional view of semiconductor device 100 along line A-A in FIG. 1, in accordance with some embodiments. FIG. 3 illustrates a partial cross-sectional view of semiconductor device 100 along line B-B in FIG. 1, in accordance with some embodiments. FIG. 4 illustrates a partial cross-sectional view of semiconductor device 100 along line C-C in FIG. 1, in accordance with some embodiments.

Referring to FIGS. 1-4, semiconductor device 100 having finFETs 105A-105B can be formed on a substrate 102 and can include fin structures 108, shallow trench isolation (STI) regions 106, gate spacers 116, gate structures 118, S/D epitaxial structures 110, and spacer layer 120. In some embodiments, finFET 105A can be n-type finFETs (NFET) and have n-type S/D epitaxial structures 110A. FinFET 105B can be p-type finFETs (PFET) and have p-type S/D epitaxial structures 110B. In some embodiments, finFETs 105A-105B can be both NFETs. In some embodiments, finFETs 105A-105B can be both PFETs. Though FIG. 1 shows two finFETs, semiconductor device 100 can have any number of finFETs. In addition, semiconductor device 100 can be incorporated into an integrated circuit (IC) through the use of other structural components, such as S/D contact structures, gate contacts, conductive vias, conductive lines, dielectric layers, passivation layers, interconnects, etc., which are not shown for simplicity. The discussion of elements of finFETs 105A-105B with the same annotations applies to each other, unless mentioned otherwise.

Substrate 102 can include a semiconductor material, such as silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structures 108 can be formed from patterned portions of substrate 102. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

As shown in FIGS. 1-4, fin structures 108 can be disposed underlying S/D epitaxial structures 110 and gate structures 118 and can extend along an X-axis through gate structures 118. As shown in FIGS. 2-4, fin structures 108 can have a fin height $108h$ along a Z-axis above STI regions 106 and adjacent fin structures 108 can have a fin spacing $108s$ along a Y-axis. In some embodiments, fin spacing $108s$ between adjacent n-type fin structures 108 can range from about 30 nm to about 60 nm. In some embodiments, fin spacing $108s$ between adjacent p-type fin structures 108 can range from about 25 nm to about 50 nm. In some embodiments, fin spacing $108s$ between adjacent n-type and p-type fin structures 108 can range from about 30 nm to about 55 nm. In some embodiments, a ratio between fin spacing $108s$ to fin height $108h$ can range from about 40% to about 90%.

Fin structures 108 underlying gate structures 118 can form channel regions of semiconductor device 100 and represent current carrying structures of semiconductor device 100. In some embodiments, S/D epitaxial structures 110 can be formed on partially-recessed fin regions on substrate 102. These partially-recessed fin regions can be partially recessed portions of fin structures 108 that are not underlying gate structures 118. In some embodiments, the removed fin portions 108* of fin structures 108 can be indicated by dotted boxes shown in FIG. 4. Top surfaces of these partially-recessed fin regions can form interfaces 121 with S/D epitaxial structures 110. In some embodiments, interfaces 121 can be coplanar with surfaces 106s of STI regions 106, as shown in FIGS. 1 and 4. In some embodiments, interfaces 121 can be below surfaces 106s of STI regions 106. In some embodiments, interfaces 121 can be above surfaces 106s of STI regions 106. Bottom surfaces of these partially-recessed portions of fin structures 108 may form interfaces (not shown) with substrate 102 and these interfaces may be either above or below the level of interfaces between STI regions 106 and substrate 102.

STI regions 106 can provide electrical isolation to fin structures 108 from adjacent fin structures and to semiconductor device 100 from neighboring structures integrated with or deposited onto substrate 102. STI regions 106 can have a dielectric material, such as silicon oxide, silicon nitride, silicon oxynitride, fluorine-doped silicate glass (FSG), a low-k dielectric material, and other suitable insulating materials. In some embodiments, STI regions 106 can include a multi-layered structure.

Referring to FIGS. 1-3, gate structures 118 can be disposed on fin structures 108 over substrate 102. In some embodiments, gate structures 118 can be formed by blanket deposition of polysilicon, followed by photolithography and etching of the deposited polysilicon. In some embodiments, protective oxide layers 112 can be disposed between fin structures 108 and gate structures 118. The formation of protective oxide layers 112 can include blanket depositing a layer of oxide material on fin structures 108, followed by a high temperature anneal process. Protective oxide layers 112 can include a suitable oxide material, such as silicon oxide. In some embodiments, protective oxide layers 112 can protect fin structures 108 during subsequent processing steps. As shown in FIGS. 2 and 3, gate structures 118 can have a gate spacing 118s along an X-axis between adjacent gate structures 118. In some embodiments, gate spacing 118s can range from about 50 nm to about 100 nm.

A hard mask layer 124 can be disposed on gate structures 118. In some embodiments, as shown in FIGS. 2 and 3, hard mask layer 124 can include a nitride layer 222 and an oxide layer 224 for profile control of gate structures 118. Hard mask layer 124 can protect gate structures 118 from subsequent processing steps (e.g., during formation of gate spacers 116 and/or S/D epitaxial structures 110).

Gate spacers 116 can be disposed on sidewalls of gate structures 118. Gate spacers 116 can include insulating material, such as, silicon oxide, silicon nitride, a low-k material, and a combination thereof. Gate spacers 116 can have a low-k material with a dielectric constant less than about 3.9. In some embodiments, gate spacers 116 can protect gate structures 118 during subsequent processing steps (e.g., during formation of S/D epitaxial structures 110).

Referring to FIGS. 1-4, spacer layer 120 can be disposed on sidewalls of gate structures 118 and in contact with gate spacers 116, on STI regions 106 as protective layers, and on sidewalls of fin structures 108. Spacer layer 120 can include insulating material, such as silicon oxide, silicon nitride, silicon carbonitride, a low-k material, and a combination thereof. Spacer layer 120 can have a low-k material with a dielectric constant less than about 3.9. In some embodiments, spacer layer 120 can have a thickness in a range from about 2 nm to about 10 nm. In some embodiments, spacer layer 120 can include a stack of layers.

In some embodiments, spacer layer 120 on sidewalls of fin structures 108 adjacent to n-type S/D epitaxial structures 110A can be referred to as "spacer structures 120A," as shown in FIG. 4. Spacer structures 120A can include a dielectric layer 120A-1 in contact with n-type S/D epitaxial structures 110A and a dielectric layer 120A-2 on dielectric layer 120A-1. Spacer layer 120 on sidewalls of fin structures 108 adjacent to p-type S/D epitaxial structures 110B can be referred to as "spacer structures 120B," as shown in FIG. 4. Spacer structures 120B can include a dielectric layer 120B-1 in contact with p-type S/D epitaxial structures 110B and a dielectric layer 120B-2 on dielectric layer 120B-1. In some embodiments, dielectric layers 120A-1 and 120B-1 can include a first dielectric material, such as silicon nitride. Dielectric layers 120A-2 and 120B-2 can include a second dielectric material different from the first dielectric material, such as silicon carbonitride. In some embodiments, dimensions and profiles of spacer structures 120A and 120B can be affected by the different dielectric materials of the stack of dielectric layers and etching rates of the different dielectric materials. In some embodiments, dielectric layer 120A-1 can have the same height above STI regions 106 as dielectric layer 120A-2. Similarly, dielectric layer 120B-1 can have the same height above STI regions 106 as dielectric layer 120B-2. As a result of the same height, S/D epitaxial structures 110A and 110B can have a symmetry profile on fin structures 108, which can reduce epitaxial defects, such as bridging defects.

In some embodiments, spacer structures 120A can have a vertical dimension 120Ah (e.g., height) above STI regions 106 along a Z-axis ranging from about 5 nm to about 15 nm. Spacer structures 120B can have a vertical dimension 120Bh (e.g., height) above STI regions 106 along a Z-axis ranging from about 5 nm to about 15 nm. A ratio of vertical dimension 120Ah or 120Bh to fin height 108h can range from about 5% to about 45%. If vertical dimensions 120Ah and 120Bh are less than about 5 nm, or the ratio is less than about 5%, S/D epitaxial structures 110A and 110B may have increased epitaxial defects, such as bridging defects, and may not form designed profiles for n-type epitaxial structures (e.g., a cone shape) and p-type epitaxial structure a diamond shape). If vertical dimensions 120Ah and 120Bh are greater than about 15 nm, or the ratio is greater than about 45%, S/D epitaxial structures 110A and 110B may have smaller dimensions, such as smaller volume and width, and device performance may not be improved. In some embodiments, vertical dimension 120Bh can be greater than vertical dimension 120Ah. A ratio of vertical dimension 120Ah to vertical dimension 120Bh can range from about 40% to about 95%. If the ratio is less than about 40%, p-type S/D epitaxial structures 110B may have increased epitaxial defects and may not form designed profiles (e.g., a diamond shape). If the ratio is greater than about 95%, n-type S/D epitaxial structures 110A may not have optimized volume and device performance may not be improved.

Referring to FIGS. 1-4, S/D epitaxial structures 110 can be formed on the partially-recessed portions of fin structures 108 and disposed on opposing sides of gate structures 118. S/D epitaxial structures 110 can function as source/drain (S/D) regions of semiconductor device 100 and can include an epitaxially-grown semiconductor material. In some embodiments, the epitaxially-grown semiconductor material can include the same material as the material of substrate 102. In some embodiments, the epitaxially-grown semiconductor material can include a different material from the material of substrate 102 and imparts a strain on the channel regions underlying gate structures 118. Since the lattice constant of such epitaxially-grown semiconductor material is different from the material of substrate 102, the channel regions are strained to advantageously increase carrier mobility in the channel regions of semiconductor device 100. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D epitaxial structures 110 can be epitaxially grown by (i) chemical vapor deposition (CVD), such as low pressure CVD (LPCVD), atomic layer CVD (ALCVD), ultrahigh vacuum CVD (UHVCVD), reduced pressure CVD (RPCVD), and any suitable CVD; (ii) molecular beam epitaxy (MBE) processes; (iii) any suitable epitaxial process; or (iv) a combination thereof. In some embodiments, S/D epitaxial structures 110 can be grown by an epitaxial deposition/partial etch process, which repeats the epitaxial deposition/partial etch process at least once. Such repeated deposition/partial etch process can be referred to as a cyclic deposition-etch (CDE) process. The CDE process can reduce epitaxial defects formed during the growth and can control the profiles of SIU epitaxial structures 110. In some embodiments, S/D epitaxial structures 110 can include multiple epitaxial layers and can be in-situ doped with n-type or p-type dopants during the epitaxial growth process.

Referring to FIGS. 1, 2, and 4, n-type S/D epitaxial structures 110A can include Si and can be in-situ doped during an epitaxial growth process using n-type dopants, such as phosphorus (P) and arsenic (As). For n-type in-situ doping, n-type doping precursors, such as phosphine ($PH_3$), arsine ($AsH_3$), and other n-type doping precursors, can be used. Each of n-type S/D epitaxial structures 110A can include epitaxially-grown n-type first epitaxial layers 207A, second epitaxial layers 209A, and third epitaxial layers 211A, as shown in FIGS. 2 and 4. First epitaxial layers 207A can be epitaxially grown on the partially-recessed portions of fin structures 108, second epitaxial layers 209A can be epitaxially grown on first epitaxial layers 207A, and third epitaxial layers 211A can be epitaxially grown on second epitaxial layers 209A. Though FIGS. 1-4 show three epitaxial layers for n-type S/D epitaxial structures 110A, n-type S/D epitaxial structures 110A can have one or more epitaxial layers and each epitaxial layer can have different compositions.

In some embodiments, each of n-type first epitaxial layers 207A, second epitaxial layers 209A, and third epitaxial layers 211A can include Si and differ from each other based on, for example, doping concentration and/or epitaxial growth process conditions. For example, first epitaxial layers 207A can be undoped or can have a dopant concentration lower than the dopant concentrations of second epitaxial layers 209A and third epitaxial layers 211A. Third epitaxial layers 211A can have a dopant concentration lower than the dopant concentrations of second epitaxial layers 209A. In some embodiments, first epitaxial layers 207A can be doped with arsenic having a concentration from about $5 \times 10^{20}$ atoms/cm$^3$ to about $2 \times 10^{21}$ atoms/cm$^3$. Second epitaxial layers 209A can be doped with phosphorus having a concentration from about $2 \times 10^{21}$ atoms/cm$^3$ to about $5 \times 10^{21}$ atoms/cm$^3$. Higher dopant concentration in second epitaxial layers 209A can reduce contact resistance between S/D epitaxial structures 110 and S/D contact structures (not shown). Third epitaxial layers 211A can be doped with phosphorus having a concentration from about $1 \times 10^{21}$ atoms/cm$^3$ to about $2 \times 10^{21}$ atoms/cm$^3$.

In some embodiments, first epitaxial layers 207A can act as a shielding layer and block dopant diffusion to channel regions of semiconductor device 100, which can mitigate SCEs and improve device performance. In some embodiments, top surfaces of first epitaxial layers 207A can be below top surfaces of fin structures 108 from about 5 nm to about 15 nm along a Z-axis to allow S/D contact structures to land on second epitaxial layers 209A and avoid dopant loss and contact resistance increase. In some embodiments, top surfaces of first epitaxial layers 207A can have a distance 110Ad from top surfaces of fin structures 108. A ratio of distance 110Ad to fin height 108h can range from about 5% to about 15% to avoid dopant loss and contact resistance increase. In some embodiments, third epitaxial layers 211A can act as a capping layer to protect second epitaxial layers 209A and prevent out-diffusion of the dopant in second epitaxial layers 209A.

In some embodiments, as shown in FIG. 4, n-type S/D epitaxial structures 110A can have a cone shape and can have a height 110Ah along a Z-axis from top surfaces of fin structures 108 (e.g., removed fin portions 108* indicated by dotted box in FIG. 4) to top surfaces of n-type S/D epitaxial structures 110A. Height 110Ah can range from about 1 nm to about 10 nm. In some embodiments, n-type S/D epitaxial structures 110A can a horizontal dimension 110Aw (e.g., width) along a Y-axis ranging from about 25 nm to about 40 nm. A ratio of horizontal dimension 110Aw to fin height 108h can range from about 55% to about 95%. If height 110Ah is less than about 1 nm, horizontal dimension 110Aw is less than about 25 nm, or the ratio is less than about 55%, a volume of n-type S/D epitaxial structures 110A may decrease and the resistance of n-type S/D epitaxial structures 110A may increase. If height 110Ah is greater than about 10 nm, horizontal dimension 110Aw is greater than about 40 nm, or the ratio is greater than about 95%, n-type S/D epitaxial structures 110A may have increased bridging defects along a Y-axis direction and may short to adjacent structures.

As shown in FIGS. 1, 3, and 4, p-type S/D epitaxial structures 110B can include Si, SiGe, Ge or III-V materials (e.g., indium antimonide (InSb), gallium antimonide (GaSb), or indium gallium antimonide (InGaSb)) and can be in-situ doped during an epitaxial growth process using p-type dopants, such as boron, indium, and gallium. For p-type in-situ doping, p-type doping precursors, such as diborane ($B_2H_6$), boron trifluoride ($BF_3$), and other p-type doping precursors, can be used. Each of p-type S/D epitaxial structures 110B can include epitaxially-grown p-type first epitaxial layers 207B, second epitaxial layers 209B, and third epitaxial layers 211B, as shown in FIGS. 3 and 4. First epitaxial layers 207B can be grown on the partially-recessed portions of fin structures 108, second epitaxial layers 209B can be grown on first epitaxial layers 207B, and third epitaxial layers 211B can be grown on second epitaxial layers 209B. In some embodiments, first epitaxial layers 207B can further include a first seed layer 207B-1, a second seed layer 207B-2, and epitaxial layers 207B-3. First and second seed layers 207B-1 and 207B-2 can act as substrate layers for an epitaxial growth of epitaxial layers 207B-3. In some embodiments, first seed layer 207B-1 can include Si and second seed layer 207B-2 can include SiGe.

In some embodiments, each of p-type first epitaxial layers 207B, second epitaxial layers 209B, and third epitaxial layers 211B can include SiGe and differ from each other based on, for example, doping concentration, epitaxial growth process conditions, and/or relative concentration of Ge with respect to Si. For example, the Ge atomic percent in first epitaxial layers 207B can be less than the Ge atomic percent in second and third epitaxial layers 209B and 211B. In some embodiments, first epitaxial layers 207B can include Ge in a range from about 20 atomic percent to about 45 atomic percent with any remaining atomic percent being Si. In some embodiments, second seed layer 207B-2 can include Ge in a range from about 20 atomic percent to about 40 atomic percent, and epitaxial layers 207B-3 can include Ge in a range from about 30 atomic percent to about 45 atomic percent, with any remaining atomic percent being Si. Second epitaxial layers 209B can include Ge in a range from about 35 atomic percent to about 65 atomic percent, and third epitaxial layers 211B can include Ge in a range from about 45 atomic percent to about 55 atomic percent, with any remaining atomic percent being Si.

The p-type epitaxial layers can have varying dopant concentration with respect to each other. For example, first epitaxial layers 207B can have a dopant concentration lower than the dopant concentrations of second and third epitaxial layers 209B and 211B. Second epitaxial layers 209B can have a dopant concentration higher than the dopant concentration third epitaxial layers 211B. In some embodiments, first epitaxial layers 207B can be doped with boron having a concentration from about $1\times10^{20}$ to about $1\times10^{21}$ atoms/cm$^3$. Second epitaxial layers 209B can be doped with boron having a concentration in a range from about $1\times10^{21}$ to about $2\times10^{21}$ atoms/cm$^3$. Higher dopant concentration in second epitaxial layers 209B can reduce contact resistance between S/D epitaxial structures 110 and S/D contact structures (not shown). Third epitaxial layers 211B can be doped with boron having a concentration in a range from about $5\times10^{20}$ about $1.5\times10^{21}$ atoms/cm$^3$.

In some embodiments, similar to first epitaxial layers 207A, first epitaxial layers 207B can act as a shielding layer and block dopant diffusion to channel regions of semiconductor device 100. In some embodiments, top surfaces of first epitaxial layers 207B can be below top surfaces of fin structures 108 from about 5 nm to about 15 nm to allow S/D contact structures to land on second epitaxial layers 209B and avoid dopant loss and contact resistance increase. In some embodiments, top surfaces of first epitaxial layers 207B can have a distance 110Bd from top surfaces of fin structures 108. A ratio of distance 110Bd to fin height 108$h$ can range from about 5% to about 15% to avoid dopant loss and contact resistance increase. In some embodiments, third epitaxial layers 211B can act as a capping layer to protect second epitaxial layers 209B and prevent out-diffusion of the dopant in second epitaxial layers 209B.

In some embodiments, as shown in FIG. 4, p-type S/D epitaxial structures 110B can have a diamond shape and can have a height 110Bh along a Z-axis from top surfaces of fin structures 108 (e.g., removed fin portions 108* indicated by a dotted box in FIG. 4) to top surfaces of p-type S/D epitaxial structures 110B. Height 110Bh can range from about 5 nm to about 15 nm. In some embodiments, p-type S/D epitaxial structures 110B can have a horizontal dimension 110Bw (e.g., width) along a Y-axis ranging from about 20 nm to about 40 nm. A ratio of horizontal dimension 110Bw to fin height 108$h$ can range from about 55% to about 95%. If height 110Bh is less than about 5 nm, horizontal dimension 110Bw is less than about 20 nm, or the ratio is less than about 55%, a volume of p-type S/D epitaxial structures 110B may decrease and the resistance of p-type S/D epitaxial structures 110B may increase. If height 110Bh is greater than about 15 nm, horizontal dimension 110Bw is greater than about 40 nm, or the ratio is greater than about 95%, p-type S/D epitaxial structures 110B may have increased bridging defects along a Y-axis direction and may short to adjacent structures.

In some embodiments, height 110Bh can be greater than height 110Ah and a ratio of height 110Ah to height 110Bh can range from about 1% to about 20%. During the formation of S/D contact structures, n-type and p-type S/D epitaxial structures 110A and 110B can be etched in the same etching process. In some embodiments, p-type S/D epitaxial structures 110B can have a higher etching rate than n-type S/D epitaxial structures 110A. With a greater height 110Bh, S/D contact structures can land on n-type and p-type S/D epitaxial structures 110A and 110B at the same level above top surfaces of substrate 102. If the ratio is less than about 1%, S/D contact structures on n-type S/D epitaxial structures 110A may land deeper on first epitaxial layers 207A and may have dopant loss, which may introduce SCEs and degrade device performance. If the ratio is greater than about 20%, S/D contact structures on n-type S/D epitaxial structures 110A may land shallower on third epitaxial layers 211A and may increase contact resistances. In addition, if the ratio is less than about 0.01 or greater than about 0.2, S/D contact structures may not land on n-type S/D epitaxial structures 110A and p-type S/D epitaxial structures 110B at the same level above top surfaces of substrate 102.

Figure 5:
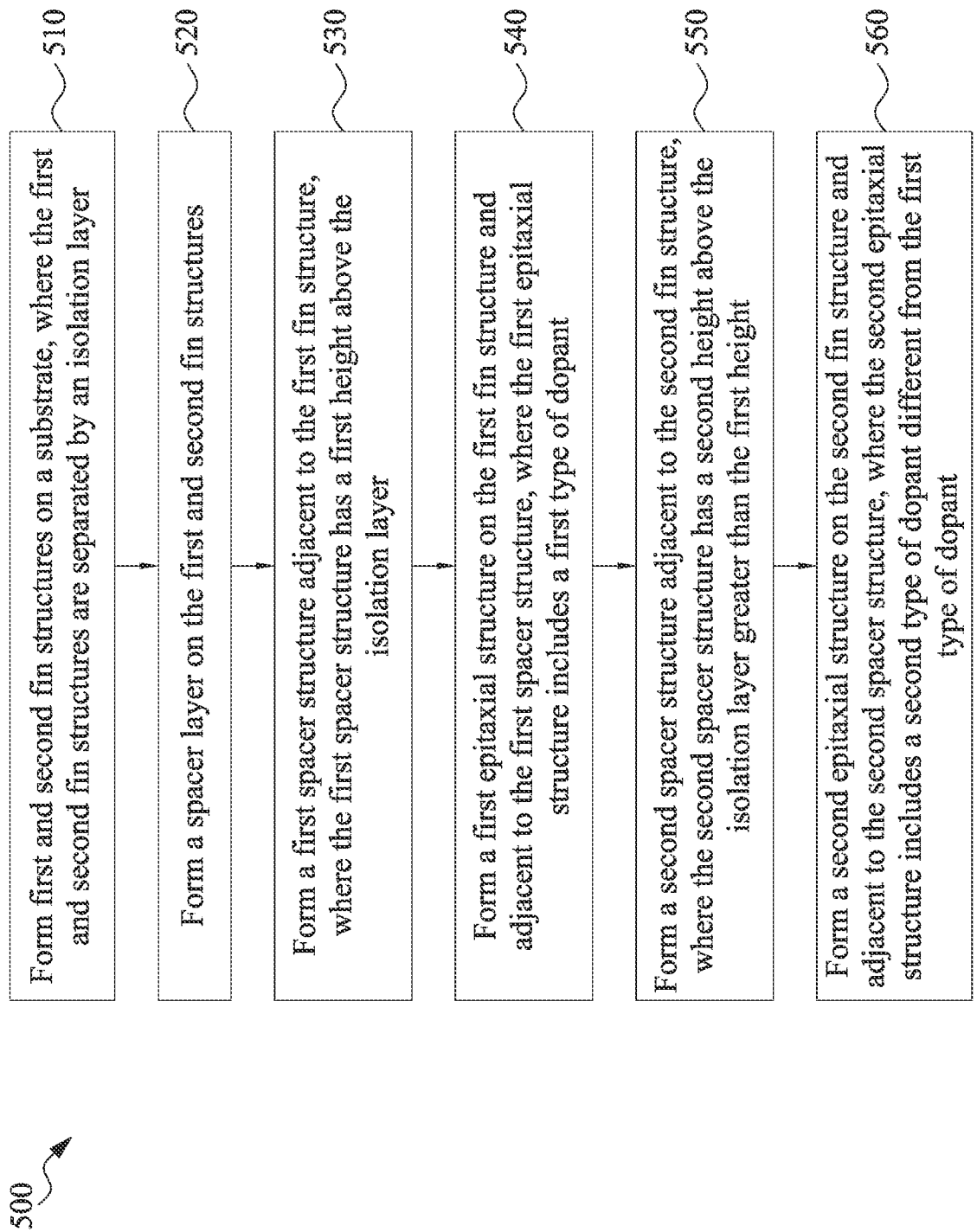
FIG. 5 is a flow diagram of a method for fabricating a semiconductor device having S/D epitaxial structures with optimized dimensions, in accordance with some embodiments.

FIG. 5 is a flow diagram of a method 500 for fabricating S/D epitaxial structures with optimized dimensions on a semiconductor device, in accordance with some embodiments. Method 500 may not be limited to finFET devices and can be applicable to devices that would benefit from the S/D epitaxial structures with optimized dimensions, such as planar FETs, finFETs, GAA FETs, etc. Additional fabrication operations may be performed between various operations of method 500 and may be omitted merely for clarity and ease of description. Additional processes can be provided before, during, and/or after method 500; one or more of these additional processes are briefly described herein. Moreover, not all operations may be needed to perform the disclosure provided herein. Additionally, some of the operations may be performed simultaneously or in a different order than shown in FIG. 5. In some embodiments, one or more other operations may be performed in addition to or in place of the presently described operations.

Figure 6:
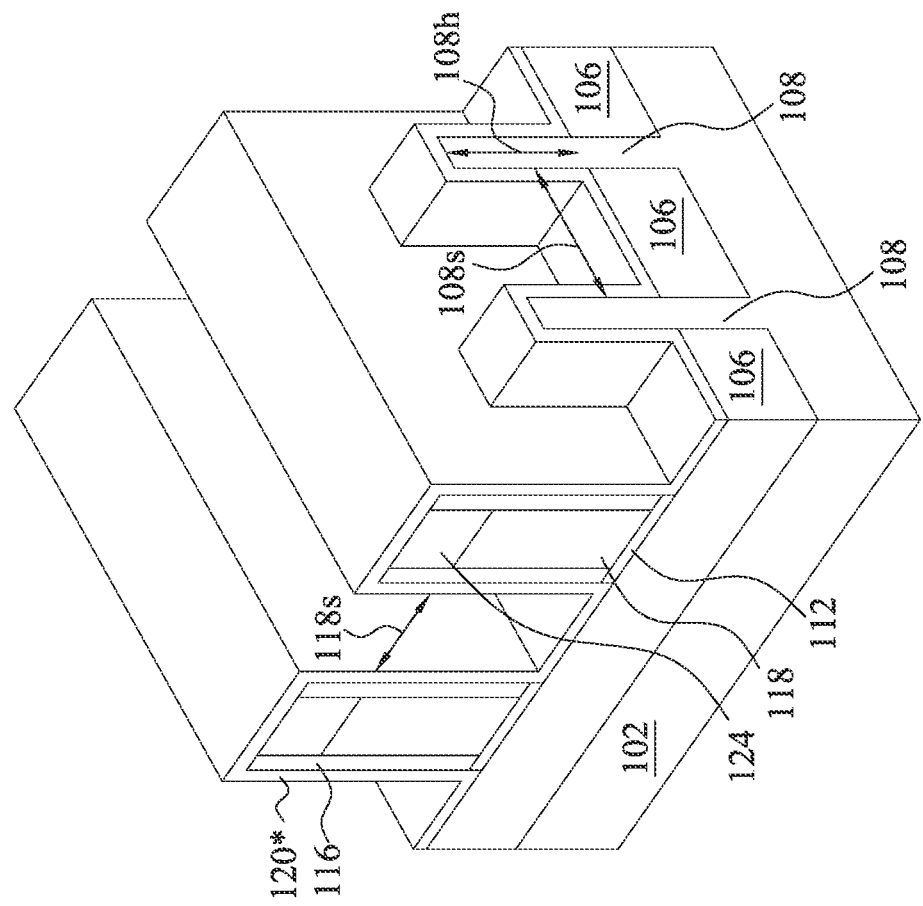
FIGS. 6, 8-15, and 17-24 illustrate an isometric view and cross-sectional views of a semiconductor device having source/drain (S/D) epitaxial structures with optimized dimensions at various stages of its fabrication, in accordance with some embodiments.
Figure 7:
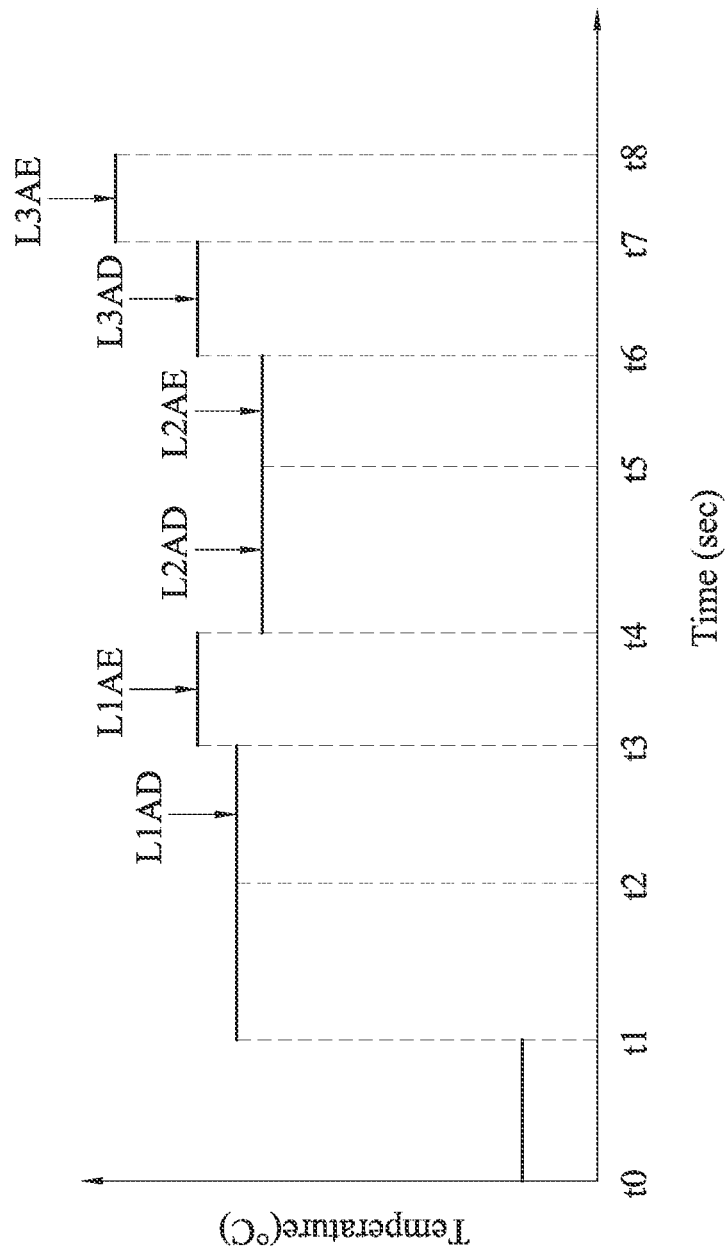
FIGS. 7 and 16 illustrate process temperatures versus process times during fabrication of a semiconductor device having S/D epitaxial structures with optimized dimensions, in accordance with some embodiments.
Figure 15:
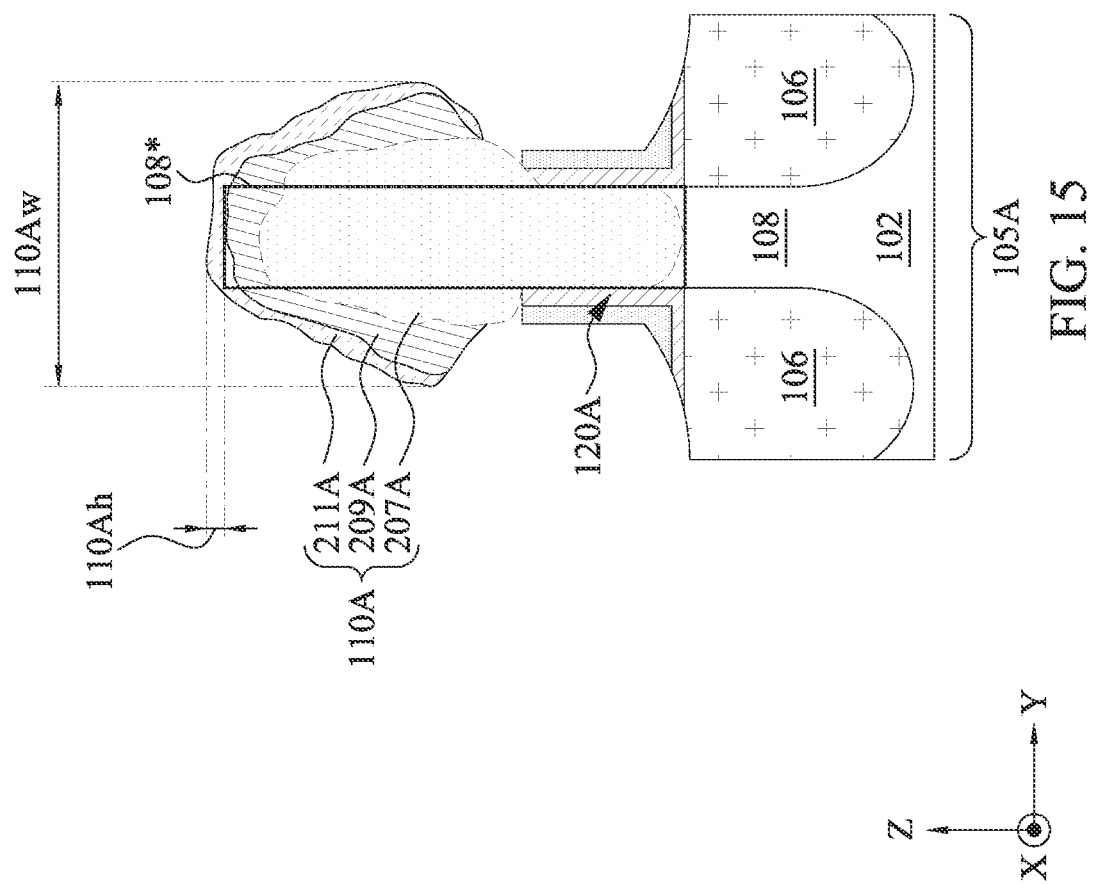
Figure 16:
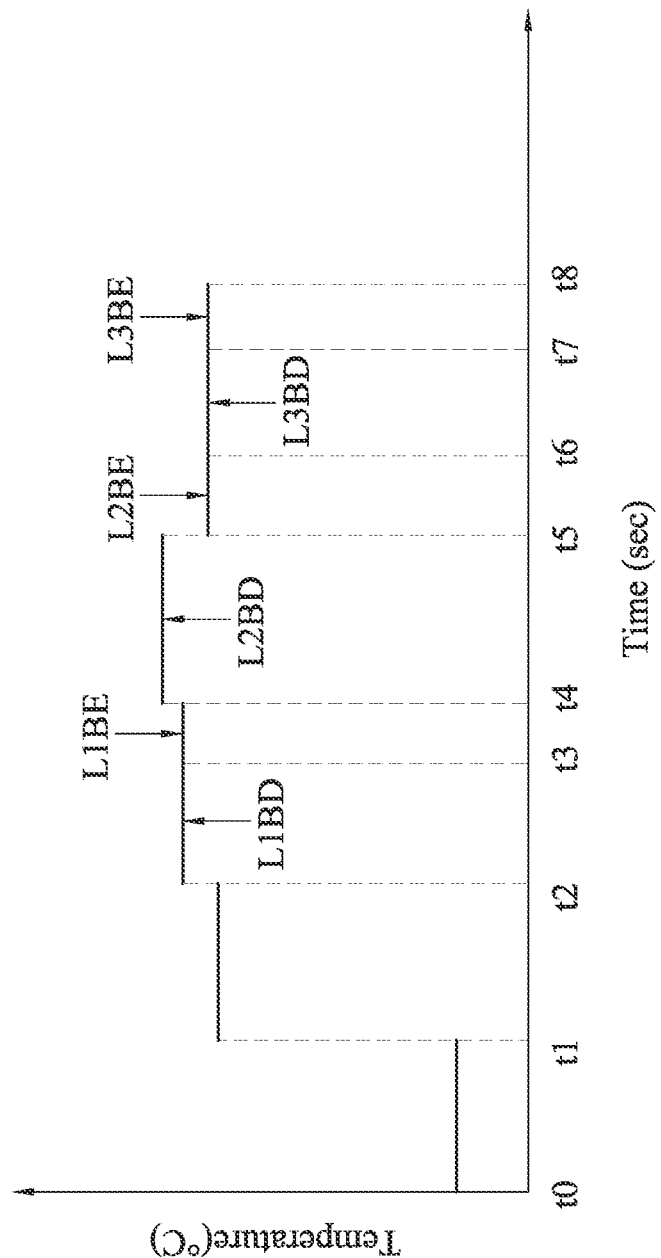

For illustrative purposes, the operations illustrated in FIG. 5 will be described with reference to the example fabrication process for fabricating semiconductor device 100 as illustrated in FIGS. 6-24. FIG. 6 illustrates an isometric view of semiconductor device 100 prior to the formation of source/drain (S/D) epitaxial structures with optimized dimensions, in accordance with some embodiments. FIGS. 7 and 16 illustrate process temperatures versus process times during fabrication of S/D epitaxial structures 110A and 110B with optimized dimensions, respectively, in accordance with some embodiments. FIGS. 8-15 and 17-24 illustrate cross-sectional views of semiconductor devices having source/drain (S/D) epitaxial structures with optimized dimensions at various stages of its fabrication, in accordance with some embodiments. Elements in FIGS. 6, 8-15, and 17-24 with the same annotations as elements in FIGS. 1-4 are described above.

In referring to FIG. 5, method 500 begins with operation 510 and the process of forming first and second fin structures on a substrate. The first and second fin structure are separated by an isolation layer. For example, as shown in FIG. 6, fin structures 108 on finFETs 105A-105B can be formed on substrate 102. Fin structures 108 can be separated by STI regions 106. Fin structures 108 can be formed from patterned portions of substrate 102. Fin structures 108 can have a fin height 108h along a Z-axis above STI regions 106 and adjacent fin structures 108 can have a fin spacing 108s along a Y-axis. In some embodiments, fin height 108h of fin structures 108 can range from about 40 nm to about 60 nm. In some embodiments, fin spacing 108s between adjacent n-type fin structures 108 can range from about 30 nm to about 60 nm. In some embodiments, fin spacing 108s between adjacent p-type fin structures 108 can range from about 25 nm to about 50 nm. In some embodiments, fin spacing 108s between adjacent n-type and p-type fin structures 108 can range from about 30 nm to about 55 nm. In some embodiments, a ratio between fin spacing 108s to fin height 108h can range from about 40% to about 90%.

The formation of fin structures 108 can be followed by formation of gate structures 118 on fin structures 108, formation of hard mask layer 124 on gate structures 118, and formation of gate spacers on sidewalls of gate structures 118, as shown in FIG. 6. In some embodiments, protective oxide layers 112 can be formed on fin structures 108 to protect fin structures 108 during the formation of gate structures 118. Protective oxide layers 112 can be removed from areas except channel regions under gate structures 118 in subsequent processes. In some embodiments, gate structures 118 can have a gate spacing 118s between adjacent gate structures 118 along an X-axis ranging from about 50 nm to about 100 nm.

Referring to FIG. 5, in operation 520, a spacer layer can be formed on the first and second fin structures. For example, as shown in FIG. 6, spacer layer 120 can be blanket deposited on fin structures 108, gate structures 118, and STI regions 106. Spacer layer 120 can include insulating material, such as silicon oxide, silicon nitride, silicon carbonitride, a low-k material, and a combination thereof. In some embodiments, spacer layer 120 can have a thickness in a range from about 2 nm to about 10 nm. In some embodiments, spacer layer 120 can include a stack of layers. In some embodiments, the formation of spacer layer 120 can include depositing a silicon nitride layer on fin structures 108 and depositing a silicon carbonitride layer on the silicon nitride layer.

Figure 8:
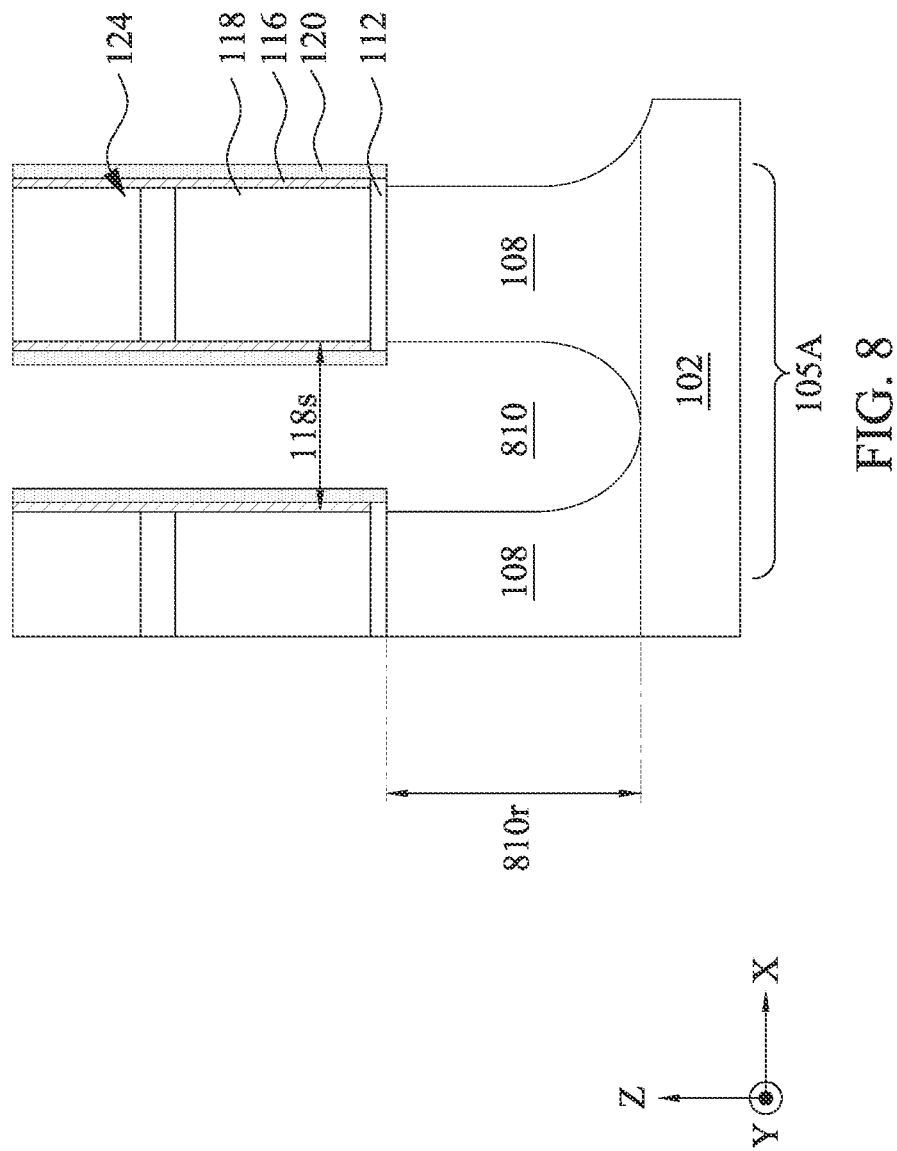
Figure 9:
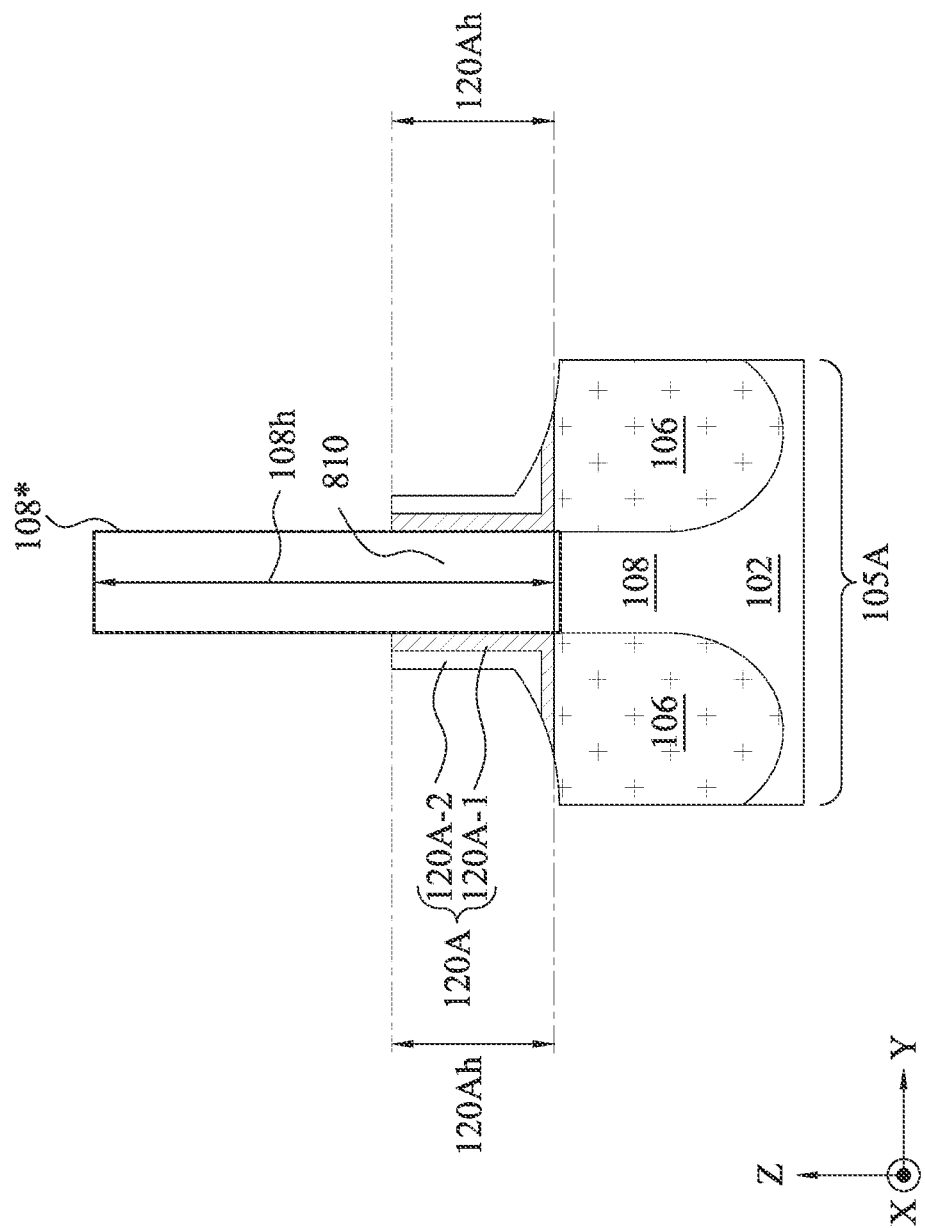

Referring to FIG. 5, in operation 530, a first spacer structure can be formed adjacent to the first fin structures. The first spacer structure has a first height above the isolation layer. For example, as shown in FIGS. 8 and 9, a portion of spacer layer 120 and a portion of fin structures 108 on finFET 105A can be selectively etched to form a pair of spacer structures 120A adjacent to opposite sidewalls of fin structures 108. Spacer structures 120A can include dielectric layer 120A-1 adjacent to fin structures 108 and dielectric layer 120A-2 on dielectric layer 120A-1. In some embodiments, dielectric layer 120A-1 can include silicon nitride and dielectric layer 120A-2 can include silicon carbonitride. In some embodiments, dielectric layers 120A-1 and 120A-2 can be removed at the same etch rate. As a result, after etching, dielectric layers 120A-1 and 120A-2 can have the same vertical dimension 120Ah (e.g., height) along a Z-axis above STI regions 106 to form symmetric n-type S/D epitaxial structures 110A over spacer structures 120A. In some embodiments, spacer layer 120 on opposite sidewalls of fin structures 108 can be removed at the same etch rate. As a result, after etching, the pair of spacer structures 120A adjacent to opposite sidewalls of fin structures 108 can be symmetrical and can have the same vertical dimension 120Ah (e.g., height) above STI regions 106 to form symmetric n-type S/D epitaxial structures 110A. Symmetric n-type S/D epitaxial structures 110A can have increased dimensions without bridging defects.

In some embodiments, spacer layer 120 and fin structures 108 on finFET 105A can be selectively etched by a dry etching process. In some embodiments, the dry etching process can be plasma-based and can include etching gases, such as carbon tetrafluoride ($CF_4$), sulfur dioxide ($SO_2$), hexafluoroethane ($C_2F_6$), chlorine ($Cl_2$), nitrogen trifluoride ($NF_3$), sulfur hexafluoride ($SF_6$), and hydrogen bromide (HBr), with mixture gases, such as hydrogen ($H_2$), oxygen ($O_2$), nitrogen ($N_2$), and argon (Ar). The dry etching process can be performed at a temperature ranging from about 25° C. to about 200° C. under a pressure from about 5 mTorr to about 50 mTorr. The flow rate of the etching gases can range from about 5 standard cubic centimeter per minute (sccm) to about 100 sccm. The plasma power can range from about 50 W to about 200 W with a bias voltage from about 30 V to about 200 V.

In some embodiments, the dry etching process can be an anisotropic etching process and can have a higher etching rate along a Z-axis than along an X-axis or a Y-axis. As a result, spacer layer 120 on top surfaces of fin structures 108 can be removed, while a portion of spacer layer 120 on sidewalls of fin structures 108 can remain. In some embodiments, the dry etching process can have a higher etching rate for fin structures 108 than for spacer layer 120. The etch selectivity between fin structures 108 and spacer layer 120 on finFET 105A can range from about 5 to about 10. In some embodiments, the dimension and profile of spacer structures 120A can be tuned by adjusting dry etching process conditions, such as the flow rate of the etching gases and the bias voltage of the plasma. In some embodiments, as shown in FIGS. 8 and 9, the dry etching process conditions can be optimized to remove fin structures 108 at a higher etching rate than spacer layer 120. As a result, after the dry etching process, fin structures 108 above STI regions 106 can be fully removed and a pair of spacer structures 120A can be formed on opposite sidewalls of fin structures having vertical dimension 120Ah above STI regions 106 from about 5 nm to about 15 nm. A ratio of vertical dimension 120Ah to fin height 108h can range from about 5% to about 45%. If vertical dimension 120Ah is less than about 5 nm, or the ratio is less than about 5%, subsequently-formed n-type epitaxial structures 110A may have increased epitaxial detects, such as bridging defects, and may not form designed profiles for n-type epitaxial structures (e.g., a cone shape). If vertical dimension 120Ah is greater than about 15 nm, or the ratio is greater than about 45%, n-type S/D epitaxial structures 110A may have smaller dimensions, such as smaller volume and width, and device performance may not be improved.

In some embodiments, after dry etching of fin structures 108, a recess 810 can be formed in fin structures 108 and a recessed depth 810r along a Z-axis can range from about 40 nm to about 70 nm. Removed fin portions 108* can be indicated by a dotted box in FIG. 9. A ratio of the recessed depth 810r to fin height 108h can range from about 90% to about 110%. If recessed depth 810r is less than about 40 nm, or the ratio is less than about 90%, a volume of subsequently-formed n-type S/D epitaxial structures 110A may decrease and the resistance of n-type S/D epitaxial structures 110A may increase. If recessed depth 810r is greater than about 70 nm, or the ratio is greater than about 110%, SCEs may be introduced and device performance may be degraded.

In some embodiments, the dimensions and profiles of spacer structures 120A and partially-recessed portions of fin structures 108 can affect the dimensions and profiles of subsequently-formed n-type S/D epitaxial structures 110A. The process conditions of the dry etching process can be adjusted to achieve optimized dimensions and profiles of spacer structures 120A and partially-recessed portions of fin structures 108, which can control the formation of n-type S/D epitaxial structures 110A with optimized dimensions and optimized profiles. In some embodiments, an area defined by gate spacing 118s and recessed depth 810r can represent a recessed volume for n-type S/D epitaxial structures 110A to fill.

Referring to FIG. 5, in operation 540, a first epitaxial structure is formed on the first fin structure and adjacent to the first spacer structure. The first epitaxial structure includes a first type of dopant. For example, as shown in FIGS. 7 and 10-15, n-type S/D epitaxial structures 110A can be formed on fin structures 108 and adjacent to spacer structures 120A. N-type S/D epitaxial structures 110A can include an n-type dopant, such as P and As. The formation of n-type S/D epitaxial structures 110A can include forming first epitaxial layers 207A on partially-recessed portions of fin structures 108, forming second epitaxial layers 209A on first epitaxial layers 207A, and forming third epitaxial layers 211A on second epitaxial layers 209A.

Referring to FIG. 7, prior to the formation of first epitaxial layers 207A, semiconductor device 100 can be pre-cleaned to remove surface residues with a plasma of ammonia ($NH_3$), nitrogen trifluoride ($NF_3$), and argon (Ar) from time t0 to time t1 for a duration of about 80 s to about 400 s at a temperature ranging from about 25° C. to about 250° C. Following the pre-clean process, semiconductor device 100 can be pre-etched by an etching gas such as hydrogen chloride (HCl) mixed with hydrogen ($H_2$) from time t1 to time t2 for a duration of about 50 s to about 150 s at a temperature from about 600° C. to about 700° C. under a pressure from about 10 torr to about 100 torr. The pre-etch process can further recess fin structures 108 (e.g., about 5% to about 10% of fin height 108h) and remove residual oxides and surface contaminations for subsequent epitaxial growth.

Figure 10:
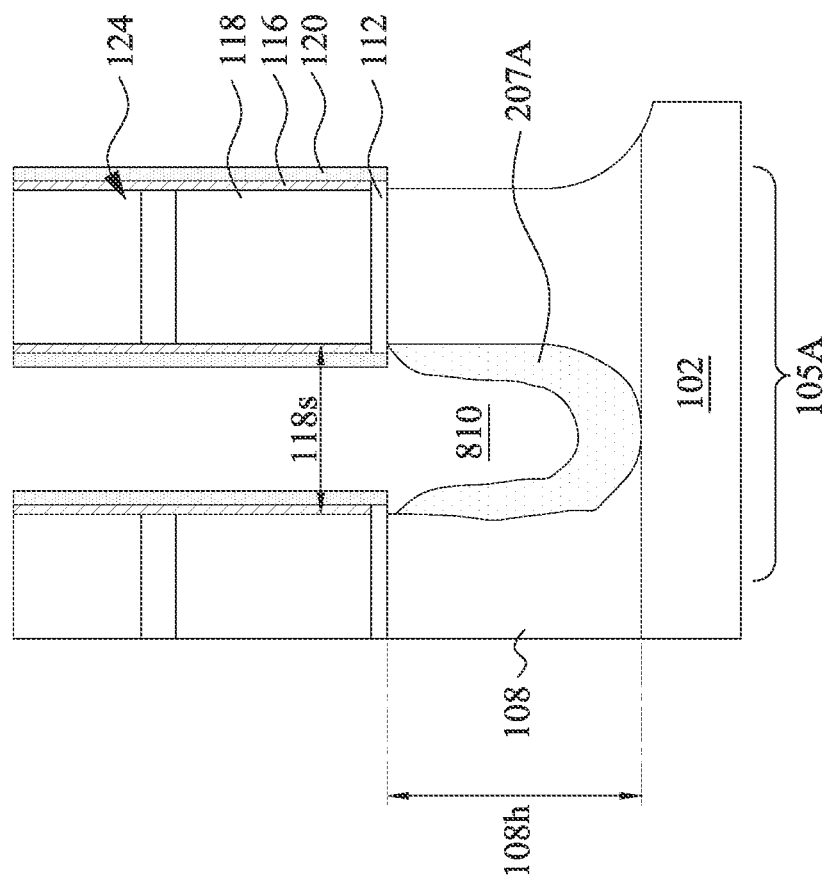
Figure 11:
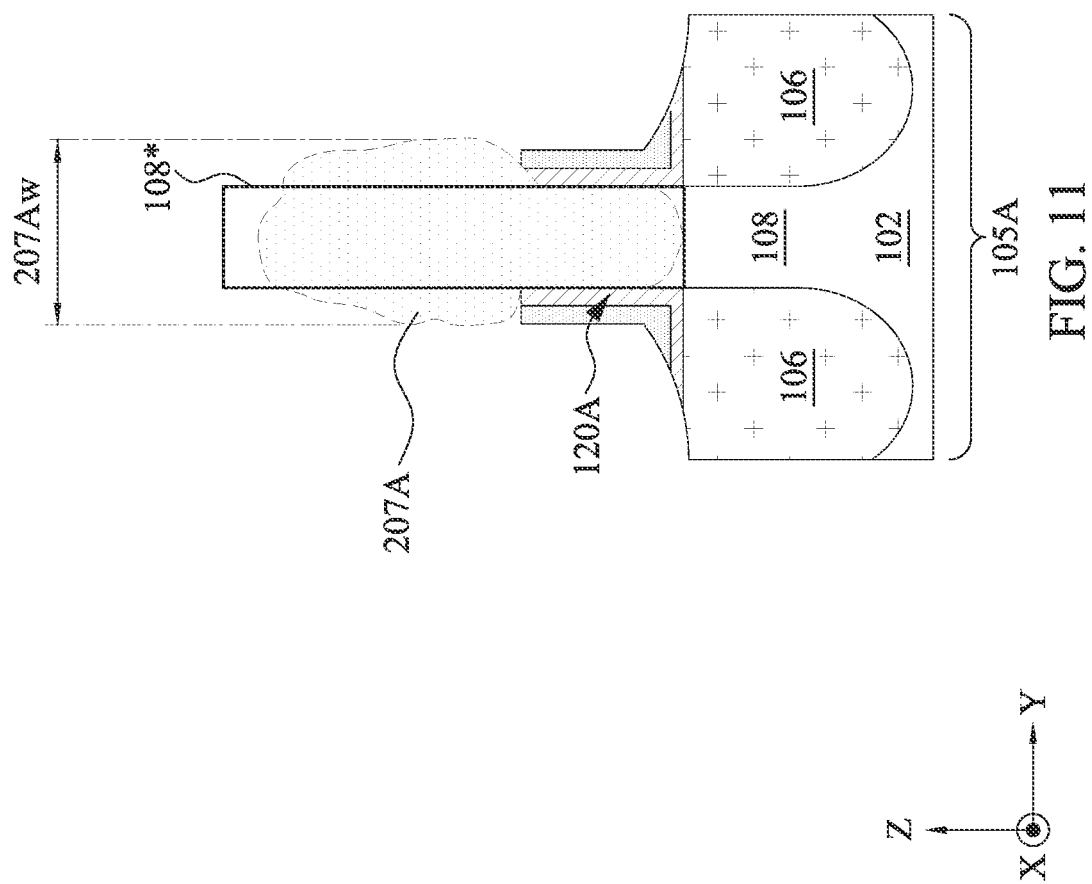

The pre-etch process can be followed by the formation of first epitaxial layers 207A. As shown in FIG. 7, a deposition process L1AD can epitaxially grow first epitaxial layers 207A (shown in FIGS. 10 and 11) from time t2 to time t3 for a duration of about 100 s to about 400 s, followed by an etching process L1AE from t3 to time t4 for a duration of about 10 s to about 80 s. In some embodiments, the deposition process L1AD can include precursors, such as dichlorosilane (DCS) or silane ($SiH_4$) as a Si precursor, $AsH_3$ and/or $PH_3$ as an n-type dopant precursor, HCl, and hydrogen ($H_2$). In some embodiments, the deposition process L1AD can dope phosphorus with a concentration from about $1\times10^{20}$ to about $8\times10^{20}$ atoms/cm$^3$. In some embodiments, the deposition process L1AD can be performed at a temperature ranging from about 600° C. to about 700° C. under a pressure from about 10 torr to about 600 torr. A ratio of the flow rates of $AsH_3$ to DCS can be less than about 50% to control the dopant concentration. In some embodiments, the etch process L1AE, can include HCl and nitrogen ($N_2$). In some embodiments, the etch process L1AE can be performed at a temperature ranging from about 650° C. to about 750° C. under a pressure from about 10 torr to about 500 torr. A ratio of the flow rate of HCl in the deposition process L1AD to the flow rate of HCl in the etch process L1AE can range from about 10% to about 30% to have a smaller thickness of first epitaxial layers 207A on sidewalls of recess 810 than the bottom of recess 810. After the deposition process L1AD and etch process L1AE, first epitaxial layers 207A can be conformally formed in recess 810, as shown in FIGS. 10 and 11. A ratio of the thickness of first epitaxial layers 207A on sidewalls of recess 810 to the bottom of recess 810 can range from about 5% to about 30%. As a result, subsequently-formed second epitaxial layers 209A can achieve a larger volume in n-type S/D epitaxial structures 110A (shown in FIG. 2) and the resistance of n-type epitaxial structures 110A can be reduced. In some embodiments, first epitaxial layers 207A can have a width 207Aw along a Y-axis ranging from about 10 nm to about 40 nm. In some embodiments, top surfaces of first epitaxial layers 207A can be below top surfaces of fin structures 108 from about 5 nm to about 15 nm to allow S/D contact structures to land on second epitaxial layers 209A shown in FIG. 2 and avoid dopant loss and contact resistance increase.

Figure 12:
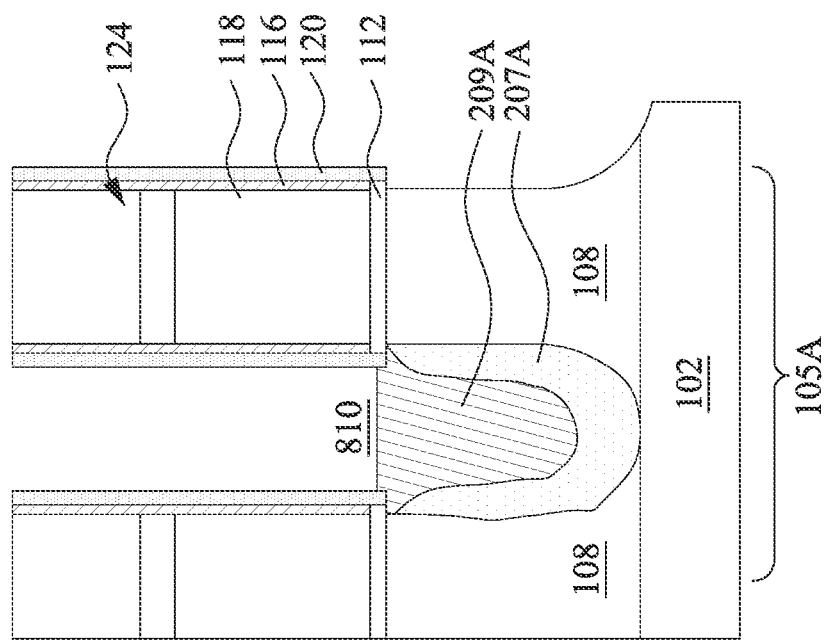
Figure 13:
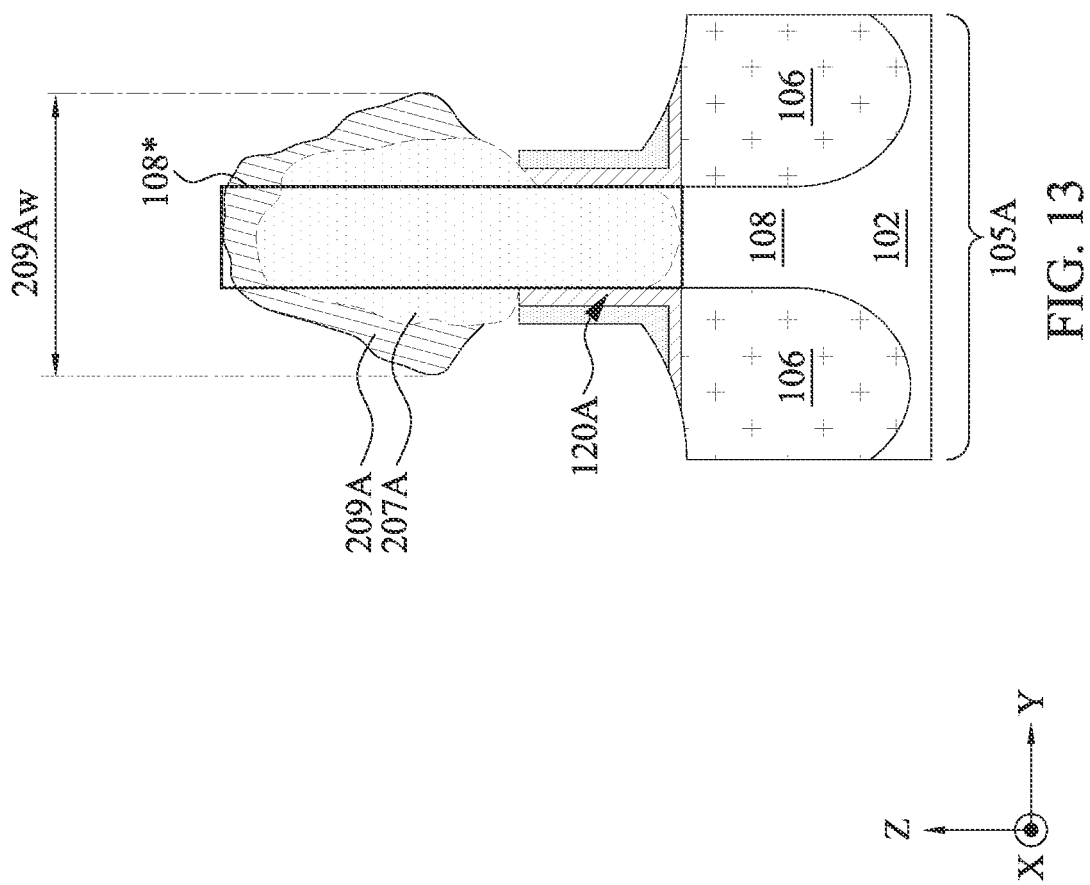

The formation of first epitaxial layers 207A can be followed by the formation of second epitaxial layers 209A. As shown in FIG. 7, a deposition process L2AD can epitaxially grow second epitaxial layers 209A (shown in FIGS. 12 and 13) from time t4 to time t5 for a duration of about 50 s to about 300 s, followed by an etching process L2AE from t5 to time t6 for a duration of about 10 s to about 80 s. In some embodiments, the deposition process L2AD can include precursors, such as silane ($SiH_4$) as a Si precursor, $PH_3$ as an n-type dopant precursor, HCl, and hydrogen ($H_2$). In some embodiments, the deposition process L2AD can be performed at a temperature ranging from about 600° C. to about 700° C. under a pressure from about 10 torr to about 600 torr. Using precursors of $SiH_4$ and $PH_3$ instead of DCS and $AsH_3$ can increase the dopant concentration of second epitaxial layers 209A and reduce the resistance of n-type S/D epitaxial structures 110A (shown in FIGS. 2 and 4). A ratio of the flow rate of $SiH_4$ to the flow rate of $PH_3$ in the deposition process L2AD to can range from about 1 to about 4 to increase the dopant concentration. In some embodiments, the etch process L2AE can be performed at a temperature ranging from about 600° C. to about 700° C. under a pressure from about 10 torr to about 500 torr. In some embodiments, the etch process L2AE can include HCl and $SiH_4$. A ratio of the flow rates of $SiH_4$ to HCl can range from about 20% to about 80% to slow the etch rate of second epitaxial layers 209A and form highly doped second epitaxial layers 209A with larger dimensions. After the deposition process L2AD and etch process L2AE, second epitaxial layers 209A can be formed in recess 810, as shown in FIGS. 12 and 13. In some embodiments, second epitaxial layers 209A can have a width 209Aw along a Y-axis ranging from about 20 nm to about 30 nm.

Figure 14:
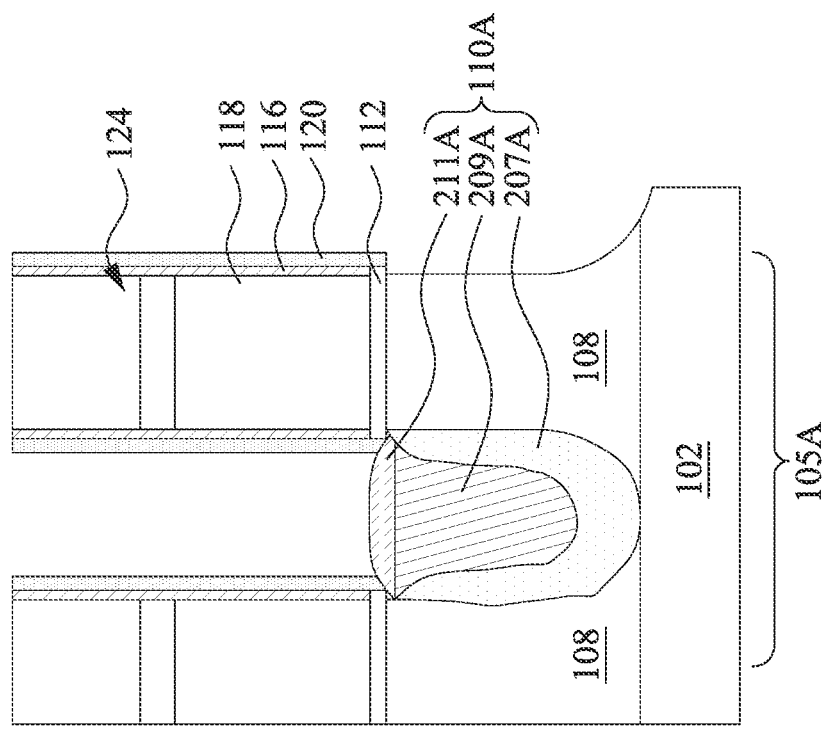

The formation of second epitaxial layers 209A can be followed by the formation of third epitaxial layers 211A. As shown in FIG. 7, a deposition process L3AD can epitaxially grow third epitaxial layers 211A (shown in FIGS. 14 and 15) from time t6 to time t7 for a duration of about 20 s to about 100 s, followed by an etching process L3AE from t7 to time t8 for a duration of about 20 s to about 80 s. In some embodiments, the deposition process L3AD can include precursors, such as dichlorosilane (DCS) as a Si precursor, $PH_3$ as an n-type dopant precursor, HCl, and hydrogen ($H_2$). In some embodiments, the deposition process L3AD can be performed at a temperature ranging from about 650° C. to about 750° C. under a pressure from about 10 torr to about 600 torr. In some embodiments, the etch process L3AE can be performed at a temperature ranging from about 700° C. to about 780° C. under a pressure from about 5 torr to about 50 torr. In some embodiments, the etch process L3AE can include HCl and GeH$_4$. A ratio of the flow rates of HCl to GeH$_4$ can range from about 2 to about 5 to increase the etch rate of third epitaxial layers 211A and epitaxially grow n-type S/D epitaxial structures 110A (shown in FIGS. 4 and 15) with desired facets (e.g., 110 facets). In addition, a higher temperature etch with GeH$_4$ for the etch process L3AE can improve activation of the dopant in third epitaxial layers 211A and reduce contact resistances with S/D contact structures. After the deposition process L3AD and etch process L3AE, third epitaxial layers 211A can be formed on second epitaxial layers 209A, as shown in FIGS. 14 and 15. In some embodiments, n-type S/D epitaxial structures 110A (shown in FIGS. 4 and 15) can have a cone shape and can have a horizontal dimension 110Aw (e.g., width) along a Y-axis ranging from about 25 nm to about 40 nm. A ratio of horizontal dimension 110Aw to fin height 108h can range from about 55% to about 95%. In some embodiments, a cross-sectional area of n-type S/D epitaxial structures 110A along an X-axis as shown in FIG. 14 can cover about 30% to about 70% of the recessed volume defined by gate spacing 118s and recessed depth 810r. These optimized dimensions and profiles of n-type S/D epitaxial structures 110A (shown in FIG. 4) can reduce SCEs, reduce epitaxial defects, reduce epitaxial structure resistance and contact resistance, and thereby improve device performance and process yield.

In some embodiments, the temperature during the deposition process L1AD can be higher than the deposition process L2AD. The temperature during the deposition process L2AD can be lower than the deposition process L3AD. The temperature during the deposition process L1AD can be similar to the deposition process L3AD. In some embodiments, the deposition processes LAD and L2AD can have a lower temperature than the etch processes L1AE and L2AE, respectively. A temperature difference between the deposition processes L1AD and L2AD and the etch processes L1AE and L2AE can range from about 10° C. to about 20° C. The process conditions of the deposition processes and etch processes, such as temperatures, pressures, and precursor flow rates can be adjusted to optimize dimensions and profiles of n-type S/D epitaxial structures 110A.

Figure 17:
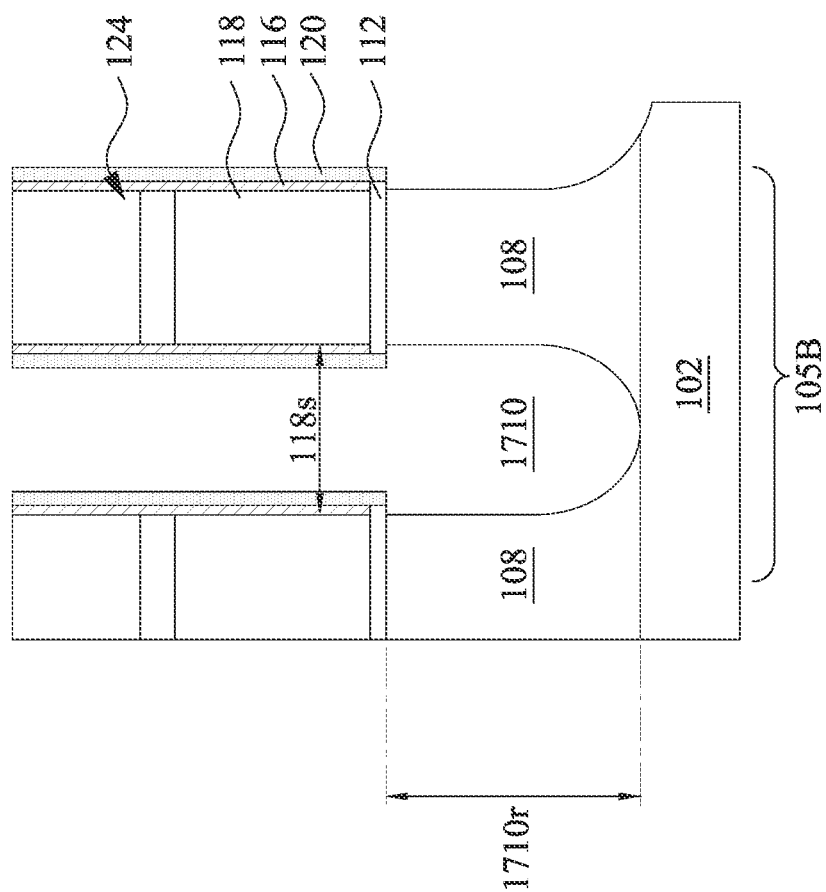
Figure 18:
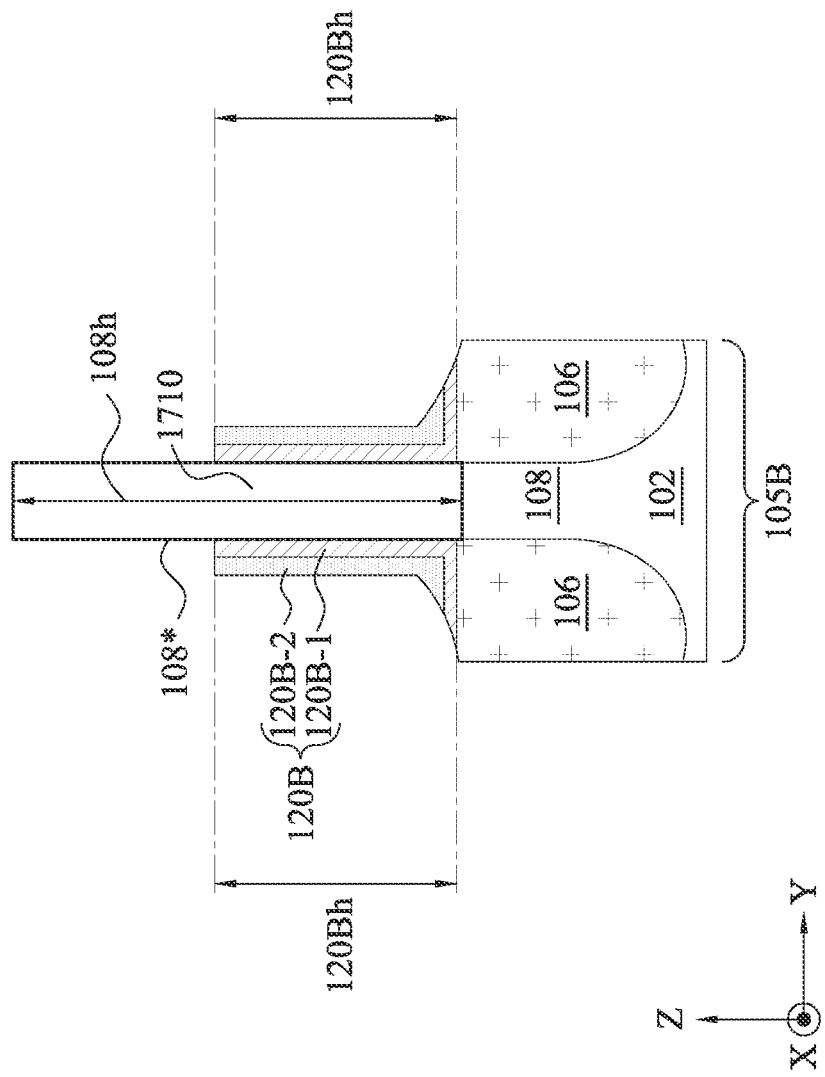

Referring to FIG. 5, in operation 550, a second spacer structure can be formed adjacent to the second fin structures. The second spacer structure has a second height above the isolation layer greater than the first height. For example, as shown in FIGS. 17 and 18, a portion of spacer layer 120 and a portion of fin structures 108 on finFET 105B can be selectively etched to form a pair of spacer structures 120B adjacent to opposite sidewalls of fin structures 108. Spacer structures 120B can have a vertical dimension 120Bh (e.g., height) above STI regions 106 greater than vertical dimension 120Ah. Spacer structures 120B can include dielectric layer 120B-1 adjacent to fin structures 108 and dielectric layer 120B-2 on dielectric layer 120B-1. Dielectric layers 120B-1 and 120B-2 can include same dielectric materials as dielectric layers 120A-1 and 120A-2, respectively. Spacer structures 120B can have same profiles as spacer structures 120A to form symmetric p-type S/D epitaxial structures 110B.

In some embodiments, spacer layer 120 and fin structures 108 on finFET 105B can be selectively etched using the same dry etching process to form spacer structures 120B. In some embodiments, as shown in FIGS. 17 and 18, the dry etching process conditions can be optimized to remove fin structures 108 at a higher etching rate than spacer layer 120. The etch selectivity between fin structures 108 and spacer layer 120 on finFET 105B can range from about 2 to about 8. As a result, after the dry etching process, fin structures 108 above STI regions 106 can be fully removed and a pair of spacer structures 120B can be formed on opposite sidewalls of fin structures having vertical dimension 120Bh above STI regions 106 from about 5 nm to about 15 nm. In some embodiments, a ratio of vertical dimension 120Ah to vertical dimension 120Bh can range from about 40% to about 95%.

In some embodiments, spacer layer 120 on finFET 105B can have an etching rate substantially the same as spacer layer 120 on finFET 105A, while fin structures 108 on finFET 105B can have an etching rate higher than fin structures 108 on finFET 105A. In some embodiments, fin structures 108 on finFET 105B can include a different material from fin structures 108 on finFET 105A and thereby can have a higher etching rate than fin structures 108 on finFET 105A. For example, fin structures 108 on finFET 105A can include silicon and fin structures 108 on finFET 105B can include silicon germanium. In some embodiments, fin structures 108 on finFET 105B can include the same material as fin structures 108 on finFET 105A, such as silicon. Process conditions of the dry etching process can be adjusted for fin structures 108 on finFET 105B to have a higher etching rate than fin structures 108 on finFET 105A. In some embodiments, the dry etching process for fin structures 108 on finFETs 105A and 105B can be in different process chambers, and the process conditions for the dry etching process can be tuned for finFET 105A or finFET 105B (e.g., increasing the etching time for finFET 105B). In some embodiments, a ratio of the etching rate of fin structures 108 on finFET 105B to the etching rate of fin structures 108 on finFET 105A can range from about 2 to about 5. If the ratio is less than about 2 or greater than about 5, the ratio of vertical dimension 120Ah to vertical dimension 120Bh may not range from about 40% to about 95%, and thereby dimensions and profiles of S/D epitaxial structures 110A and 110B may not be optimized.

In some embodiments, after thy etching of fin structures 108, a recess 1710 can be formed in fin structures 108 and a recessed depth 1710r along a Z-axis can range from about 40 nm to about 70 nm. Removed fin portions 108* can be indicated by a dotted box in FIG. 18. A ratio of the recessed depth 1710r to fin height 108h can range from about 95% to about 120%. If recessed depth 1710r is less than about 40 nm, or the ratio is less than about 95%, a volume of subsequently-formed p-type S/D epitaxial structures 110B may decrease and the resistance of p-type S/D epitaxial structures 110B may increase. If recessed depth 1710r is greater than about 70 nm, or the ratio is greater than about 120%, SCEs may be introduced and device performance may be degraded.

In some embodiments, similar to n-type epitaxial structures 110A, the dimensions and profiles of spacer structures 120B and partially-recessed portions of fin structures 108 can affect the dimensions and profiles of subsequently-formed p-type S/D epitaxial structures 110B. The process conditions of the dry etching process can be adjusted to achieve optimized dimensions and profiles for spacer structures 120A-120B and partially-recessed portions of fin structures 108, which can control the formation of S/D epitaxial structures 110A-110B with optimized dimensions and profiles. In some embodiments, an area defined by gate spacing 118s and recessed depth 1710r can represent a recessed volume for p-type S/D epitaxial structures 110B to fill.

Referring to FIG. 5, in operation 560, a second epitaxial structure is formed on the second fin structure and adjacent to the second spacer structure. The second epitaxial structure includes a second type of dopant different from the first type of dopant. For example, as shown in FIGS. 16 and 19-24, p-type S/D epitaxial structures 110B can be formed on fin structures 108 and adjacent to spacer structures 120B. P-type S/D epitaxial structures 110B can include a p-type dopant, such as B, different from the n-type dopant in n-type S/D epitaxial structures 110A. The formation of p-type S/D epitaxial structures 110B can include forming first epitaxial layers 207B on partially-recessed portions of fin structures 108, forming second epitaxial layers 209B on first epitaxial layers 207B, and forming third epitaxial layers 211B on second epitaxial layers 209B.

Referring to FIG. 16, prior to the formation of first epitaxial layers 207B, semiconductor device 100 can be pre-cleaned to remove surface residues with a plasma of ammonia ($NH_3$), nitrogen trifluoride ($NF_3$), and argon (Ar) from time t0 to time t1 for a duration of about 80 s to about 400 s at a temperature ranging from about 25° C. to about 250° C. Following the pre-clean process, first seed layer 207B-1 and second seed layer 207B-2 can be formed by a deposition process from time t1 to time t2 for a duration of about 30 s to about 80 s. In some embodiments, the deposition process can be performed at a temperature ranging from about 600° C. to about 650° C. under a pressure from about 10 torr to about 50 torr. In some embodiments, the deposition process can include precursors, such as dichlorosilane (DCS) as a Si precursor, $GeH_4$ as a Ge precursor, and HCl. In some embodiments, first seed layer 207B-1 can include Si and second seed layer 207B-2 can include SiGe. In some embodiments, first epitaxial layers 207B can include a stack of seed layers having a gradient of Ge concentration.

The formation of first seed layer 207B-1 and second seed layer 207B-2 can be followed by the formation of epitaxial layers 207B-3. As shown in FIG. 16, a deposition process L1BD can epitaxially grow epitaxial layers 207B-3 (shown in FIGS. 19 and 20) from time t2 to time t3 for a duration of about 30 s to about 80 s, followed by an etching process L1BE from t3 to time t4 for a duration of about 5 s to about 20 s. In some embodiments, the deposition process L1BD can include precursors, such as dichlorosilane (DCS) and $SiH_4$ as Si precursors, $GeH_4$ as a Ge precursor, diborane ($B_2H_6$) as a p-type dopant precursor, and HCl. In some embodiments, the deposition process L1BD can be performed at a temperature ranging from about 600° C. to about 650° C. under a pressure from about 10 torr to about 50 torr. The deposition process L1BD can have a constant gas ratio among the precursors. In some embodiments, the etch process L1BE can include HCl. In some embodiments, the etch process L1BE can be performed at a temperature ranging from about 600° C. to about 650° C. under a pressure from about 10 torr to about 50 torr.

Figure 19:
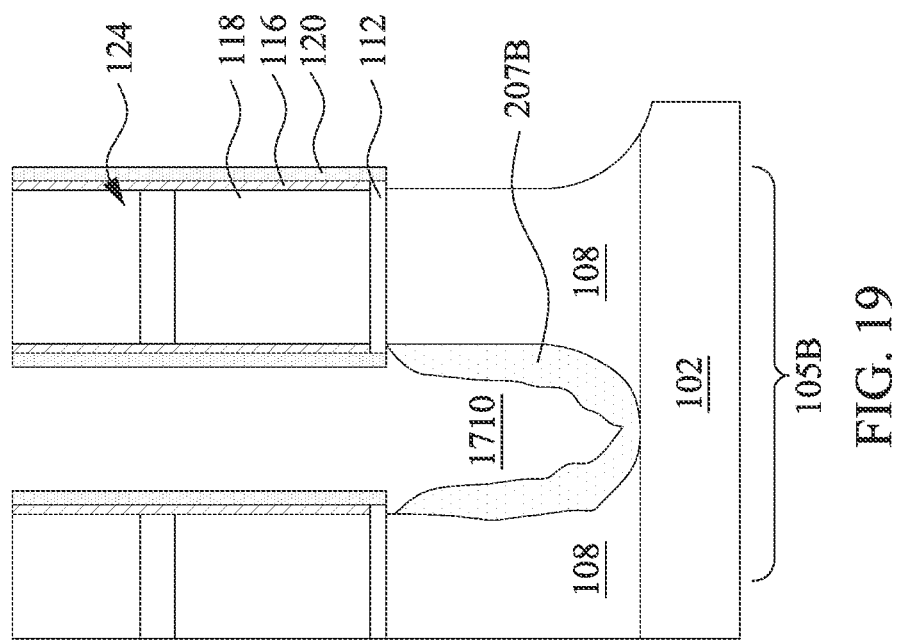
Figure 20:
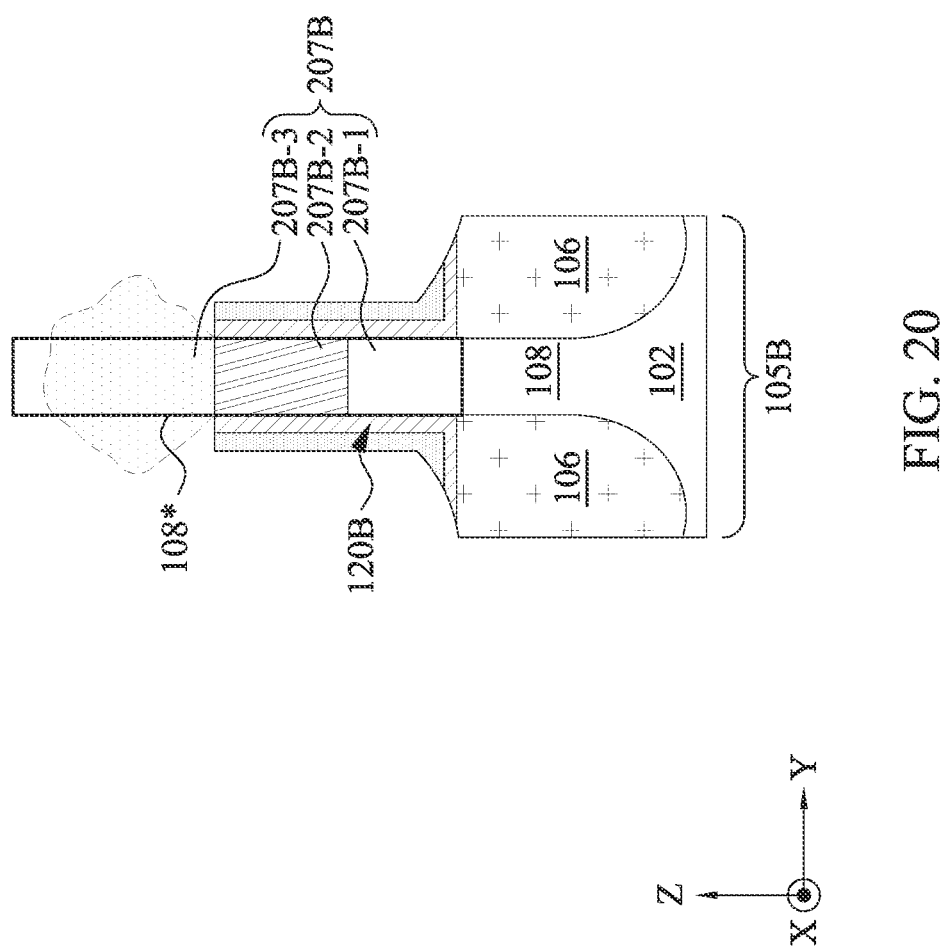

After the formation of first seed layer 207B-1 and second seed layer 207B-2, the deposition process L1BD, and etch process L1BE, first epitaxial layers 207B can be conformally formed in recess 1710, as shown in FIGS. 19 and 20. A ratio of the thickness of first epitaxial layers 207B on sidewalls of recess 1710 to the bottom of recess 1710 can range from about 70% to about 90%. As a result, subsequently-formed second epitaxial layers 209B can achieve a larger volume in P-type S/D epitaxial structures 110B. In some embodiments, top surfaces of first epitaxial layers 207B can be below top surfaces of fin structures 108 from about 5 nm to about 15 nm to allow S/D contact structures to land on second epitaxial layers 209B and avoid dopant loss and contact resistance increase.

Figure 21:
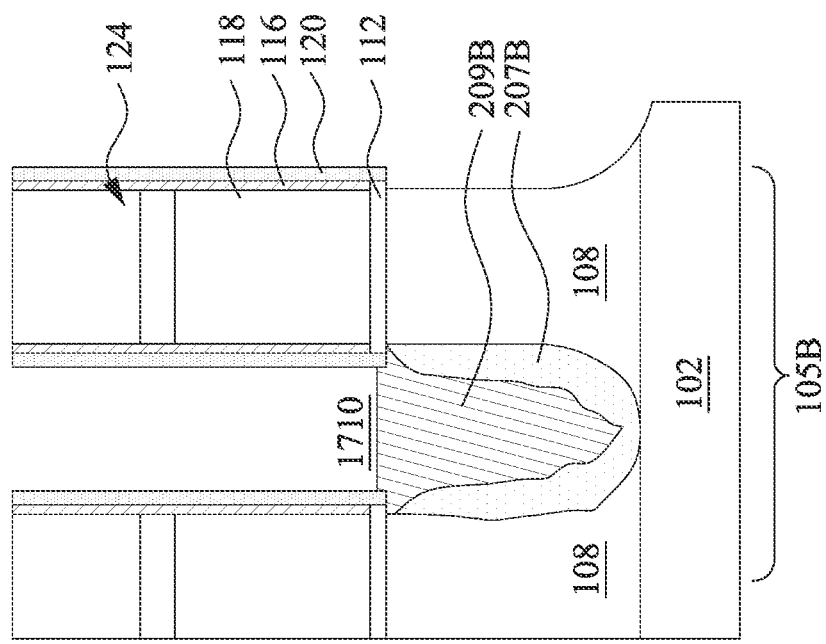
Figure 22:
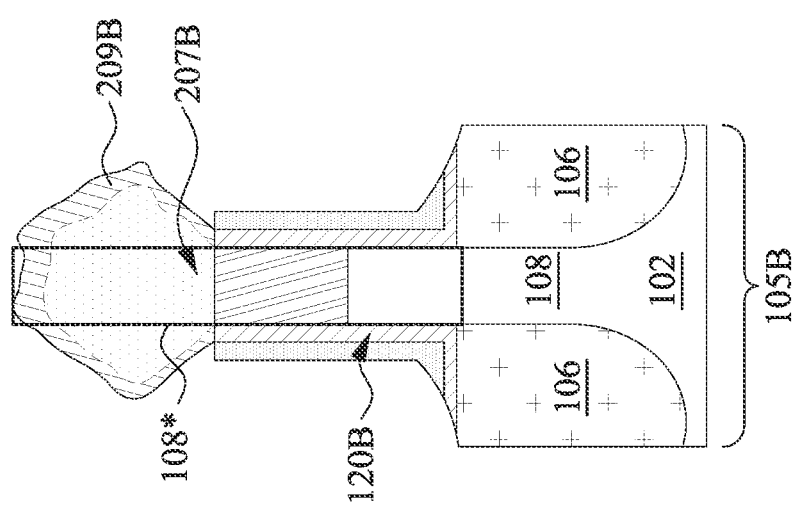

The formation of first epitaxial layers 207B can be followed by the formation of second epitaxial layers 209B. As shown in FIG. 16, a deposition process L2BD can epitaxially grow second epitaxial layers 209B (shown in FIGS. 21 and 22) from time t4 to time t5 for a duration of about 50 s to about 300 s, followed by an etching process L2BE from t5 to time t6 for a duration of about 10 s to about 80 s. In some embodiments, the deposition process L2BD can include precursors, such as DCS as a Si precursor, $GeH_4$ as a Ge precursor, $B_2H_6$ as a p-type dopant precursor, and HCl. The Si precursor can include DCS without $SiH_4$ for a control of dopant concentration. In some embodiments, the deposition process L2BD can be performed at a temperature ranging from about 600° C. to about 650° C. under a pressure from about 10 torr to about 50 torr. The deposition process L2BD can have a linear ramping of dopant precursor flow rate to form a gradient doping in second epitaxial layers 209B. In some embodiments, second epitaxial layers 209B (shown in FIGS. 21 and 22) can include multiple sublayers, such as first epitaxial sublayers, second epitaxial sublayers, and third epitaxial sublayers with a gradient concentration of p-type dopant. In some embodiments, the etch process L2BE can be performed at a temperature ranging from about 600° C. to about 650° C. under a pressure from about 10 torr to about 50 torr. In some embodiments, the etch process L2BE can include HCl. After the deposition process L2BD and etch process L2BE, second epitaxial layers 209B can be formed in recess 1710, as shown in FIGS. 21 and 22.

Figure 23:
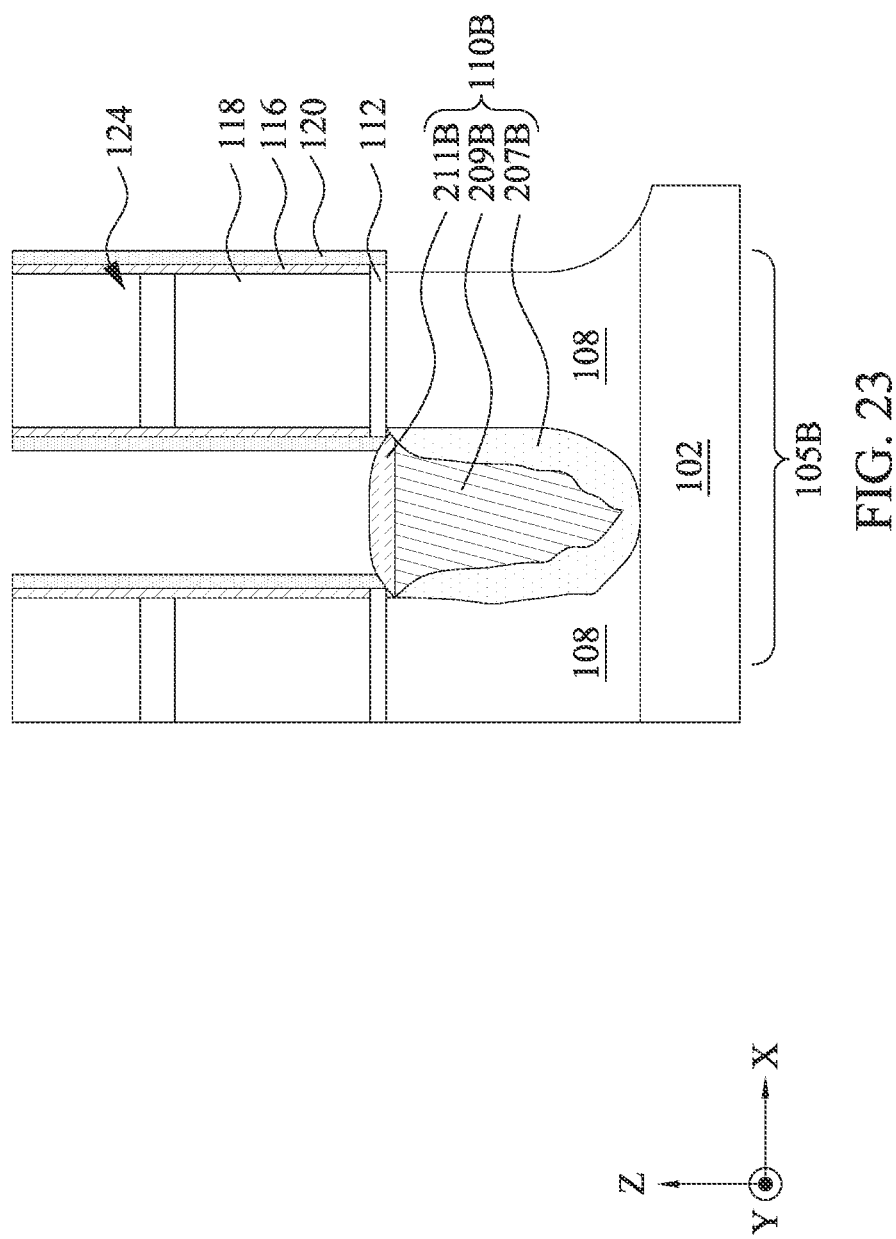
Figure 24:
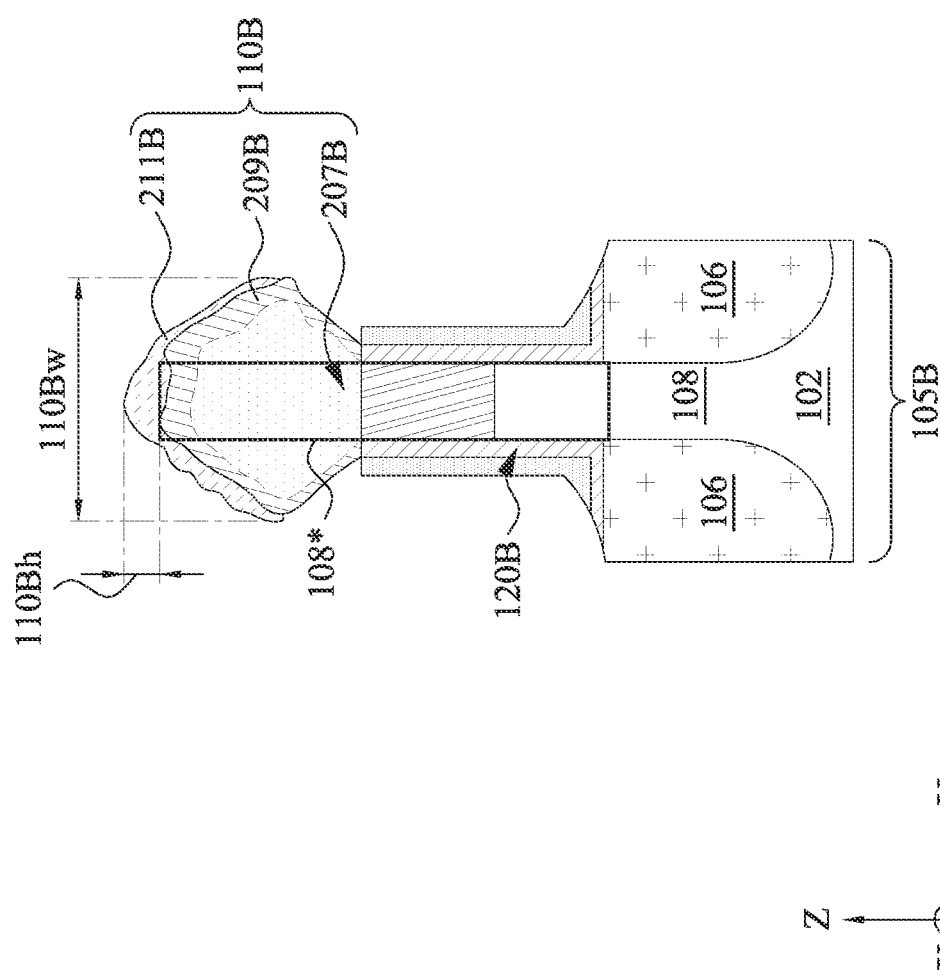

The formation of second epitaxial layers 209B can be followed by the formation of third epitaxial layers 211B. As shown in FIG. 16, a deposition process L3BD can epitaxially grow third epitaxial layers 211B (shown in FIGS. 21 and 22) from time t6 to time t7 for a duration of about 20 s to about 100 s, followed by an etching process L3BE from t7 to time t8 for a duration of about 10 s to about 50 s. In some embodiments, the deposition process L3BD can include precursors, such as DCS as a Si precursor, $GeH_4$ as a Ge precursor, $B_2H_6$ as a p-type dopant precursor, and HCl. The deposition process L3BD can have a constant gas ratio among the precursors. In some embodiments, the deposition process L3BD can be performed at a temperature ranging from about 600° C. to about 650° C. under a pressure from about 10 torr to about 50 torr. In some embodiments, the etch process L3BE can be performed at a temperature ranging from about 600° C. to about 650° C. under a pressure from about 5 torr to about 50 torr. In some embodiments, the etch process L3BE can include HCl and $GeH_4$ to increase the etch rate of third epitaxial layers 211B and epitaxially grow p-type S/D epitaxial structures 110B (shown in FIGS. 4 and 24) with desired facets (e.g., 111 facets). After the deposition process L3BD and etch process L3BE, third epitaxial layers 211B can be formed on second epitaxial layers 209B, as shown in FIGS. 23 and 24. Third epitaxial layers 211B can act as a capping layer to prevent dopant out-diffusion from highly doped second epitaxial layers 209B. In some embodiments, p-type S/D epitaxial structures 110B (shown in FIGS. 4 and 24) can have a diamond shape and can have a horizontal dimension 110Bw (e.g., width) along a Y-axis ranging from about 20 nm to about 40 nm. A ratio of horizontal dimension 110Bw to fin height 108h can range from about 55% to about 95%. In some embodiments, a cross-sectional area of p-type S/D epitaxial structures 110B along an X-axis as shown in FIG. 23 can cover about 30% to about 70% of the recessed volume defined by gate spacing 118s and recessed depth 1710r. These optimized dimensions and profiles of p-type S/D epitaxial structures 110B (shown in FIG. 4) can reduce SCEs, reduce epitaxial defects, reduce epitaxial structure resistance and contact resistance, and thereby improve device performance and process yield.

In some embodiments, the temperature during the deposition of first seed layer 207B-1 and second seed layer 207B-2 can be higher than the temperature during the deposition process L1Bd. The temperature during the deposition process L1BD can be higher than the temperature during the deposition process L2Bd. The temperature during the deposition process L2BD can be lower than the temperature during the deposition process L3Bd. The temperature during the deposition of first seed layer 207B-1 and second seed layer 207B-2 can be similar to the temperature during the deposition process L3Bd. In some embodiments, a temperature difference between the deposition processes can range from about 10° C. to about 20° C. In some embodiments, a pressure difference between the deposition processes can range from about 10 torr to about 20 torr. In some embodiments, the deposition processes for n-type S/D epitaxial structures 110A can have higher pressures and higher temperatures than the deposition processes for p-type S/D epitaxial structures 110B. In some embodiments, the process conditions of the deposition and etch processes of S/D epitaxial structures 110A-110B can be optimized to form both n-type S/D epitaxial structures 110A and p-type S/D epitaxial structures 110B with optimized volume and dimension to reduce SCEs, reduce epitaxial defects, reduce epitaxial structure resistance and contact resistance, and thereby improve device performance and process yield. In some embodiments, semiconductor device 100 having n-type and p-type S/D epitaxial structures 110A-110B with optimized dimensions and profiles can improve process yield by about 2% to about 20% and improve device performance by about 2% to about 10%.

Various embodiments in the present disclosure provide example methods for forming S/D epitaxial structures 110A-110B with optimized dimensions on semiconductor device 100. The example methods in the present disclosure can form spacer layer 120 on fin structures 108. As shown in FIGS. 1-4, fin structures 108 can be separated by STI regions 106 and can have fin height 108$h$ above STI regions 106. In some embodiments, spacer layer 120 can include a layer of silicon nitride and a layer of silicon carbonitride. A portion of spacer layer 120 and fin structures 108 on finFET 105A can be selectively removed to form spacer structures 120A adjacent to sidewalls of fin structures 108. Spacer structures 120A can have a vertical dimension 120Ah above STI regions 106. A ratio of vertical dimension 120Ah to fin height 108$h$ can range from about 5% to about 45%. N-type S/D epitaxial structures 110A can be formed having a cone shape with optimized dimensions on fin structures 108 and between spacer structures 120A. N-type S/D epitaxial structures 110A can have a horizontal dimension 110Aw and a ratio of horizontal dimension 110Aw to fin height 108$h$ can range from about 55% to about 95%. A portion of spacer layer 120 and fin structures 108 on finFET 105B can be selectively removed to form spacer structures 120B adjacent to sidewalls of fin structures 108. Spacer structures 120B can have a vertical dimension 120Bh above STI regions 106 greater than vertical dimension 120Ah. A ratio of vertical dimension 120Ah to vertical dimension 120Bh can range from about 40% to about 95%. P-type S/D epitaxial structures 110B can be formed having a diamond shape with optimized dimensions on fin structures 108 and between spacer structures 120B. P-type S/D epitaxial structures 110B can have a horizontal dimension 110Bw and a ratio of the horizontal dimension 110Bw to fin height 108$h$ can range from about 55% to about 95%. P-type SIU epitaxial structures 110B can have a different type of dopant from n-type S/D epitaxial structures 110A. With the control of the dimensions and profiles for spacer structures 120A-120B and growth processes of S/D epitaxial structures 110A-110B, both n type S/D epitaxial structures 110A and p-type S/D epitaxial structures 110B can have optimized dimensions and profiles to reduce SCEs, reduce epitaxial defects, improve device performance, and improve process yield.

In some embodiments, a method includes forming first and second fin structures on a substrate, forming a spacer layer on the first and second fin structures, forming a first spacer structure adjacent to the first fin structure, forming a first epitaxial structure on the first fin structure and adjacent to the first spacer structure, forming a second spacer structure adjacent to the second fin structure, and forming a second epitaxial structure on the second fin structure and adjacent to the second spacer structure. The first and second fin structures are separated by an isolation layer. The first spacer structure has a first height above the isolation layer. The first epitaxial structure includes a first type of dopant. The second spacer structure has a second height above the isolation layer greater than the first height. The second epitaxial structure includes a second type of dopant different from the first type of dopant.

In some embodiments, a method includes forming first and second fin structures on a substrate, forming a gate structure on the first and second fin structures, forming a spacer layer on the first and second fin structures, the isolation layer, and the gate structure, forming a first pair of spacer structures on opposite sidewalls of the first fin structures, and forming a first epitaxial structure on the first fin structure and between the first pair of spacer structures. The method further includes forming a second pair of spacer structures on opposite sidewalls of the second fin structures and forming a second epitaxial structure on the second fin structure and between the second pair of spacer structures. The first and second fin structures are separated by an isolation layer. The first pair of spacer structures have a first height above the isolation layer. The first epitaxial structure includes a first type of dopant. The second pair of spacer structures have a second height above the isolation layer greater than the first height. The second epitaxial structure includes a second type of dopant different from the first type of dopant.

In some embodiments, a semiconductor device includes first and second fin structures on a substrate, an isolation layer between the first and second fin structures, a first epitaxial structure on the first fin structure and a second epitaxial structure on the second fin structure, and a first spacer structure adjacent to the first epitaxial structure having a first height above the isolation layer and a second spacer structure adjacent to the second epitaxial structure having a second height above the isolation layer. The first epitaxial structure includes a first type of dopant and the second epitaxial structure includes a second type of dopant different from the first type of dopant. The first height is less than the second height.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming first and second fin structures on a substrate, wherein the first and second fin structures are separated by an isolation layer;
   forming a spacer layer on the first and second fin structures, wherein the spacer layer includes a layer of first dielectric material and a layer of second dielectric material;
   forming a first spacer structure adjacent to the first fin structure, wherein the first spacer structure has a first height above the isolation layer and includes the layer of first dielectric material and the layer of second dielectric material;
   forming a first epitaxial structure on the first fin structure and adjacent to the first spacer structure, wherein the first epitaxial structure comprises a first type of dopant;
   forming a second spacer structure adjacent to the second fin structure, wherein the second spacer structure has a second height above the isolation layer greater than the first height and top surfaces of the isolation layer and the second fin structure adjacent to the second spacer structure are at a substantially same level; and
   forming a second epitaxial structure on the second fin structure and adjacent to the second spacer structure, wherein the second epitaxial structure comprises a second type of dopant different from the first type of dopant.

2. The method of claim 1, wherein the forming the spacer layer comprises:
   depositing a layer of first dielectric material on the first and second fin structures; and
   depositing, on the layer of first dielectric material, a layer of second dielectric material different from the first dielectric material.

3. The method of claim 1, wherein the forming the spacer layer comprises:
   depositing a layer of silicon nitride on the first and second fin structures; and
   depositing a layer of silicon carbonitride on the layer of silicon nitride.

4. The method of claim 1, wherein the forming the first spacer structure comprises:
   removing a portion of the spacer layer on the first fin structure at a first etch rate; and
   removing a portion of the first fin structure at a second etch rate greater than the first etch rate.

5. The method of claim 1, wherein the forming the second spacer structure comprises:
   removing a portion of the spacer layer on the second fin structure at a first etch rate; and
   removing a portion of the second fin structure at a second etch rate greater than the first etch rate.

6. The method of claim 1, wherein the forming the first spacer structure and the forming the second spacer structure comprise:
   removing a portion of the first fin structure at a first etch rate; and
   removing a portion of the second fin structure at a second etch rate, wherein a ratio of the first etch rate to the second etch rate ranges from about 2 to about 5.

7. The method of claim 1, wherein the forming the first epitaxial structure comprises:
   forming a first epitaxial layer with a first dopant concentration;
   forming a second epitaxial layer with a second dopant concentration greater than the first dopant concentration; and
   forming a third epitaxial layer with a third dopant concentration less than the second dopant concentration.

8. The method of claim 1, wherein the forming the first epitaxial structure and the forming the second epitaxial structure comprise:
   epitaxially growing the first epitaxial structure with (110) facets; and
   epitaxially growing the second epitaxial structure with (111) facets.

9. A method, comprising:
   forming first and second fin structures on a substrate, wherein the first and second fin structures are separated by an isolation layer;
   forming a gate structure on the first and second fin structures;
   forming a spacer layer on the first and second fin structures, the isolation layer, and the gate structure;
   forming a first pair of spacer structures on opposite sidewalls of the first fin structure, wherein the first pair of spacer structures have a first height above the isolation layer;
   forming a first epitaxial structure on the first fin structure and between the first pair of spacer structures, wherein the first epitaxial structure is an isolated epitaxial structure and the first epitaxial structure comprises a first type of dopant;
   forming a second pair of spacer structures on opposite sidewalls of the second fin structure after forming the first epitaxial structure, wherein the second pair of spacer structures have a second height above the isolation layer greater than the first height; and
   forming a second epitaxial structure on the second fin structure and between the second pair of spacer structures, wherein the second epitaxial structure comprises a second type of dopant different from the first type of dopant.

10. The method of claim 9, wherein the forming the spacer layer comprises:
    depositing a layer of first dielectric material on the first and second fin structures, the isolation layer, and the gate structure; and
    depositing, on the layer of first dielectric material, a layer of second dielectric material different from the first dielectric material.

11. The method of claim 10, wherein the forming the first pair of spacer structures comprises removing the layer of first dielectric material and the layer of second dielectric material at a same etch rate.

12. The method of claim 9, wherein the forming the first pair of spacer structures comprises:
    removing a portion of the spacer layer on the opposite sidewalls of the first fin structure at a first etch rate; and removing a portion of the first fin structure above the isolation layer at a second etch rate greater than the first etch rate.

13. The method of claim 9, wherein the forming the first pair of spacer structures comprises:
removing a portion of the spacer layer on a first sidewall and on a second sidewall of the first fin structure at a same etch rate, wherein the first sidewall is opposite to the second sidewall.

14. The method of claim 9, wherein the forming the first pair of spacer structures and the forming the second pair of spacer structures comprise:
removing a portion of the first fin structure above the isolation layer at a first etch rate; and
removing a portion of the second fin structure above the isolation layer at a second etch rate, wherein a ratio of the first etch rate to the second etch rate ranges from about 2 to about 5.

15. A semiconductor device, comprising:
first and second fin structures on a substrate;
an isolation layer between the first and second fin structures;
a first epitaxial structure on the first fin structure and a second epitaxial structure on the second fin structure, wherein the first epitaxial structure comprises a first type of dopant and the second epitaxial structure comprises a second type of dopant different from the first type of dopant, and wherein top surfaces of the first and second epitaxial structures are at a substantially same level; and
a first spacer structure adjacent to the first epitaxial structure having a first height above the isolation layer and a second spacer structure adjacent to the second epitaxial structure having a second height above the isolation layer, wherein each of the first and second spacer structures includes a layer of first dielectric material and a layer of second dielectric material, and wherein the first height is less than the second height.

16. The semiconductor device of claim 15, wherein a ratio of the first height to the second height ranges from about 40% to about 95%.

17. The semiconductor device of claim 15, wherein:
the first and second fin structures have a third height above the isolation layer; and
a ratio of the first height or the second height to the third height ranges from about 5% to about 45%.

18. The semiconductor device of claim 15, wherein:
the first and second fin structures have a third height;
the first epitaxial structure has a first width and the second epitaxial structure has a second width; and
a ratio of the first width or the second width to the third height ranges from about 55% to about 95%.

19. The semiconductor device of claim 15, wherein the first epitaxial structure has a cone shape and the second epitaxial structure has a diamond shape.

20. The semiconductor device of claim 15, wherein:
the first epitaxial structure has a third height above a top surface of the first fin structure;
the second epitaxial structure has a fourth height above a top surface of the second fin structure; and
the fourth height is greater than the third height.

* * * * *